(12) United States Patent
Kiuchi et al.

(10) Patent No.: US 8,264,666 B2
(45) Date of Patent: Sep. 11, 2012

(54) EXPOSURE APPARATUS, EXPOSURE METHOD, AND METHOD OF MANUFACTURING DEVICE

(75) Inventors: Tohru Kiuchi, Tokyo (JP); Hideo Mizutani, Yokohama (JP)

(73) Assignee: Nikon Corporation, Tokyo (JP)

( * ) Notice: Subject to any disclaimer, the term of this patent is extended or adjusted under 35 U.S.C. 154(b) by 325 days.

(21) Appl. No.: 12/692,443

(22) Filed: Jan. 22, 2010

(65) Prior Publication Data

US 2010/0265483 A1 Oct. 21, 2010

Related U.S. Application Data

(60) Provisional application No. 61/202,580, filed on Mar. 13, 2009.

(51) Int. Cl.
*G03B 27/42* (2006.01)
*G03B 27/58* (2006.01)
*G03B 27/32* (2006.01)

(52) U.S. Cl. ................. 355/53; 355/47; 355/77

(58) Field of Classification Search ............... 355/47, 355/53, 72, 67, 77; 356/399–401; 250/548
See application file for complete search history.

(56) References Cited

U.S. PATENT DOCUMENTS

| 5,652,645 | A | 7/1997 | Jain | |
| 5,923,403 | A * | 7/1999 | Jain | .................. 355/26 |
| 6,900,915 | B2 | 5/2005 | Nanyo et al. | |
| 7,095,546 | B2 | 8/2006 | Mala et al. | |
| 7,292,308 | B2 * | 11/2007 | Galburt et al. | .................. 355/47 |
| 7,738,081 | B2 * | 6/2010 | Jacobs | .................. 355/73 |

FOREIGN PATENT DOCUMENTS

| EP | 0 779 530 A1 | 6/1997 |
| EP | 1 022 616 A2 | 7/2000 |

(Continued)

OTHER PUBLICATIONS

Written Opinion of the International Searching Authority issued in corresponding International Application No. PCT/JP2010/054163 mailed Jun. 2, 2010.

(Continued)

*Primary Examiner* — Hung Henry Nguyen
(74) *Attorney, Agent, or Firm* — Finnegan, Henderson, Farabow, Garrett & Dunner, L.L.P.

(57) ABSTRACT

An exposure apparatus of one aspect of the present invention is provided with a moving mechanism that moves a first portion of a belt-shaped substrate that has photosensitivity in a first heading along a first direction and moves a second portion of the substrate in a second heading along the first direction, a stage mechanism that holds a mask and moves it in a third heading along a second direction in synchronization with the movement of the substrate, and a projection optical system. The projection optical system forms a first projection image of the pattern on the first portion so that the third heading on the mask and the first heading on the first portion optically correspond, and forms a second projection image of the pattern on the second portion so that the third heading on the mask and the second heading on the second portion optically correspond.

27 Claims, 13 Drawing Sheets

FOREIGN PATENT DOCUMENTS

| | | |
|---|---|---|
| EP | 1 986 224 A1 | 10/2008 |
| JP | 10-503300 | 3/1998 |
| JP | 2004-78136 | 3/2004 |
| JP | 2006-113437 | 4/2006 |
| JP | 2006-524349 | 10/2006 |
| JP | 2007-114385 | 5/2007 |
| JP | 2007-235041 | 9/2007 |

OTHER PUBLICATIONS

International Search Report, from the European Patent Office in corresponding International Application No. PCT/JP2010/054163, mailed Jun. 2, 2010.

N. Michio, "Exposure Apparatus and Device Manufacturing Method," English language trranslation of JP-2007-235041, Sep. 13, 2007.

* cited by examiner

EXPOSURE APPARATUS, EXPOSURE METHOD, AND METHOD OF MANUFACTURING DEVICE

CROSS-REFERENCE TO RELATED APPLICATION

This application is non-provisional application claiming benefit of provisional application No. 61/202,580, filed Mar. 13, 2009, the contents of which are incorporated herein by reference.

BACKGROUND

1. Field of the Invention

The present invention relates to a scanning-type exposure apparatus that transfers a pattern onto a substrate that has photosensitivity.

2. Description of Related Art

Liquid crystal display panels are often used as display devices such as personal computers and displays. Recently, there has been devised a method of manufacturing a display panel by patterning with a method of photolithography a transparent thin film electrode on a flexible polymers sheet (photosensitive substrate). As an exposure apparatus that is used in this photolithography step, an exposure apparatus that transfers a mask pattern onto a belt-shaped (strip-shaped) photosensitive substrate that is transported by roll-to-roll (hereinbelow referred to as a roll-to-roll type exposure apparatus) has been proposed (for example, refer to Japanese Patent Application Publication No. 2007-114385A).

In roll-to-roll type exposure apparatuses, an improvement has been sought in the throughput of the transfer of a pattern onto the belt-shaped photosensitive substrate.

SUMMARY

A purpose of some aspects of the present invention is to provide an exposure apparatus that can achieve an improvement in throughput related to scanning and exposure to, for example, a belt-shaped photosensitive substrate that is transported by roll-to-roll, an exposure method, and a method of manufacturing a device.

According to a first aspect of the present invention, an exposure apparatus is provided that is constituted by a moving mechanism that moves a first substrate that has photosensitivity in a first heading along a first direction and that moves a second substrate that has photosensitivity in a second heading that is opposite to the first heading along the first direction; a stage mechanism that holds a mask that has a pattern, and moves in a third heading along a second direction in synchronization with the movement in the first direction of the first substrate and the second substrate; and a projection optical system that receives light via the pattern, forms a first projection image of the pattern on the first substrate so that the third heading on the mask and the first heading on the first substrate optically correspond, and forms a second projection image of the pattern on the second substrate so that the third heading on the mask and the second heading on the second substrate optically correspond.

According to a second aspect of the present invention, an exposure apparatus is provided that is constituted by a moving mechanism that moves a first portion of a belt-shaped substrate that has photosensitivity in a first heading along a first direction and that moves a second portion of the substrate in a second heading that is opposite to the first heading along the first direction; a stage mechanism that holds a mask that has a pattern, and moves in a third heading along a second direction in synchronization with the movement in the first direction of the first portion and the second portion; and a projection optical system that receives light via the pattern, forms a first projection image of the pattern on the first portion so that the third heading on the mask and the first heading on the first portion optically correspond, and forms a second projection image of the pattern on the second portion so that the third heading on the mask and the second heading on the second portion optically correspond.

According to a third aspect of the present invention, an exposure method is provided that includes a step that moves a first substrate that has photosensitivity in a first heading along a first direction and that moves a second substrate that has photosensitivity in a second heading that is opposite to the first heading along the first direction; a step that moves a mask that has a pattern in a third heading along a second direction in synchronization with the movement in the first direction of the first substrate and the second substrate; and a step that receives light from the pattern, forms a first projection image of the pattern on the first substrate so that the third heading on the mask and the first heading on the first substrate optically correspond, and forms a second projection image of the pattern on the second substrate so that the third heading on the mask and the second heading on the second substrate optically correspond.

According to a fourth aspect of the present invention, an exposure method is provided that includes a step that moves a first portion of a belt-shaped substrate that has photosensitivity in a first heading along a first direction and that moves a second portion of the substrate in a second heading that is opposite to the first heading along the first direction; a step that moves a mask that has a pattern in a third heading along a second direction in synchronization with the movement in the first direction of the first portion and the second portion; a step that receives light from the pattern and forms a first projection image of the pattern on the first portion so that the third heading on the mask and the first heading on the first portion optically correspond, and a step that receives light from the pattern and forms a second projection image of the pattern on the second portion so that the third heading on the mask and the second heading on the second portion optically correspond.

According to a fifth aspect of the present invention, a method of manufacturing a device is provided that includes a step that, using the exposure apparatus of the present invention, transfers the pattern to a substrate; a step that develops the substrate to which the pattern has been transferred, and forms on the substrate a transfer pattern layer of a shape corresponding to the pattern; and a step that processes the substrate via the transfer pattern layer.

According to one aspect of the present invention, it is possible to simultaneously perform scanning and exposure of a first projection image to a first portion of a belt-shaped photosensitive substrate that moves in first heading and scanning and exposure of a first projection image to a second portion of a belt-shaped photosensitive substrate that moves in second heading by causing a mask to move once in a third heading. Also, by repeating reciprocal movement of the mask along a first direction over a plurality of times, it is possible to continuously form in an alternating manner on a substrate that moves continuously along a predetermined path a region to which the first projection image has been transferred and a region to which the second projection image has been transferred. As a result, in the exposure apparatus of the present invention, it is possible to improve the throughput of the scanning and exposure to, for example, a belt-shaped photosensitive substrate that is conveyed by roll-to-roll.

DESCRIPTION OF EMBODIMENTS

Figure 1:
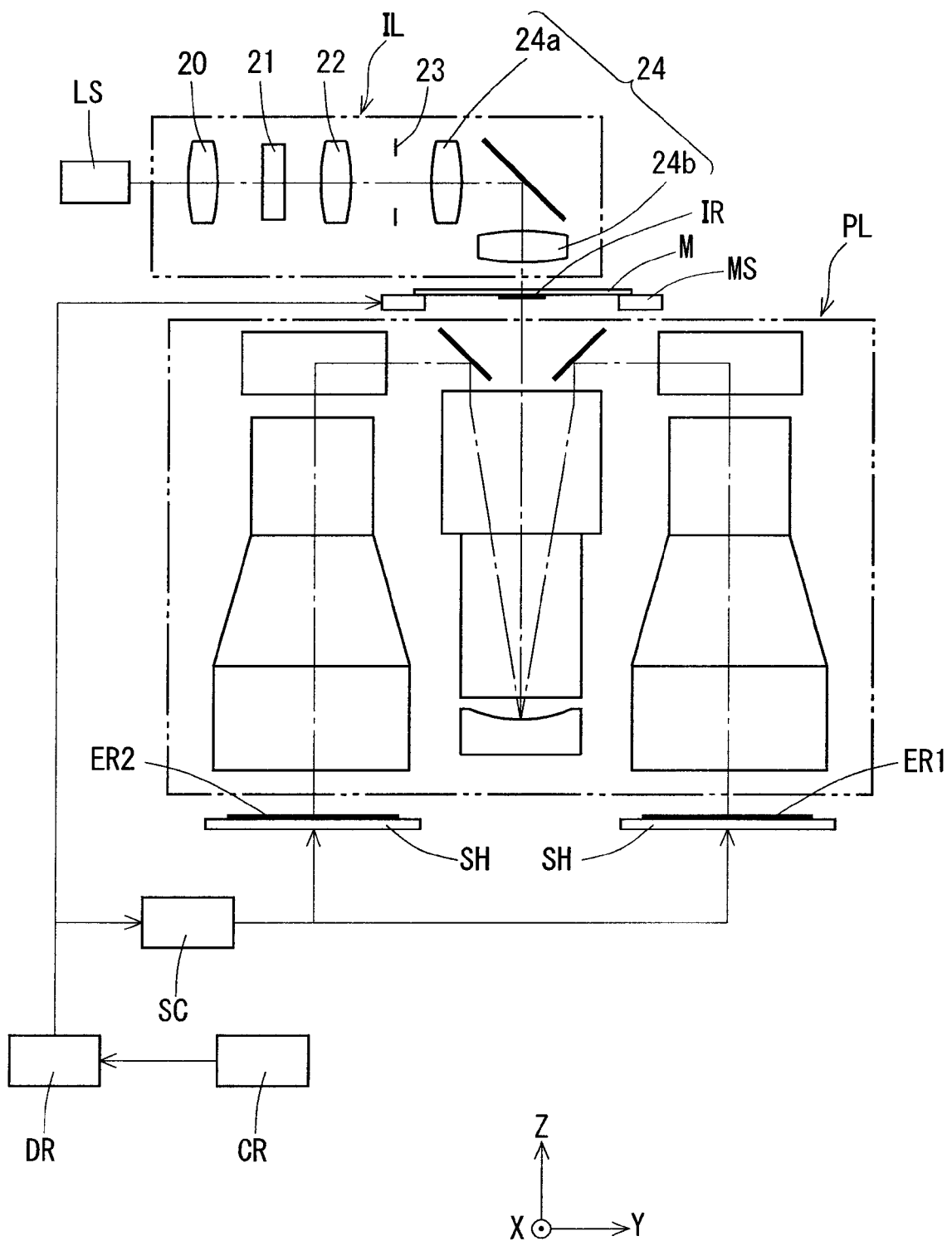
FIG. 1 is a drawing that schematically shows the constitution of the exposure apparatus of the embodiment of the present invention.

An embodiment of the present invention shall be described based on the appended drawings. FIG. 1 is a drawing that schematically shows the constitution of the exposure apparatus of the embodiment of the present invention. In the present embodiment, as shown in FIG. 1, the present invention is applied to a roll-to-roll type exposure apparatus that, while relatively moving a mask M and a belt-shaped sheet SH with respect to a projection optical system PL, projection-exposes (transfers) a pattern of a mask M onto a sheet SH. In FIG. 1, the Z axis is set to the normal direction to the transfer surface (photosensitive surface, exposed surface) of the sheet SH as the photosensitive substrate, the Y axis to the direction parallel to the page surface of FIG. 1 in the plane that is parallel to the transfer surface of the sheet SH, and the X axis to the direction perpendicular to the page surface of FIG. 1 in the plane that is parallel to the transfer surface of the sheet SH.

The exposure apparatus of the present embodiment is provided with an illumination optical system IL that illuminates the pattern region of the mask M, a mask stage MS that holds and moves the mask M that has the pattern, a projection optical system PL that forms a magnified image of the pattern of the mask M on the sheet SH, a moving mechanism SC that moves (conveys) the sheet SH according to a roll-to-roll format, a drive system DR that drives the mask stage MS and the moving mechanism SC, and a main control system CR that collectively controls the operation of the drive system DR and the like. The sheet SH is a flexible (provided with flexibility) belt-shaped polymer sheet to which a photoresist (photosensitive material) is applied.

In the illumination optical system IL, illumination light for exposure (exposure light) is supplied from a light source LS. As the exposure light, it is possible to use i line (365 nm wavelength) light selected from the emitted light of an ultra-high pressure mercury lamp, a pulse light that is the third harmonic of a YAG laser (355 nm wavelength), KrF excimer laser light (248 nm wavelength), and the like. The illumination optical system IL is provided with, in the order of the incoming light, a collimator lens 20, a fly-eye lens 21, a condenser optical system 22, a mask blind 23 as a variable visual field aperture, and an illumination imaging optical system 24 (24a and 24b).

The light that is emitted from the light source LS illuminates an illumination region IR on the mask M via the illumination optical system IL. The illumination region IR has a predetermined external shape that extends in an elongated manner in the X direction. Light from the illumination region IR of the mask M via the projection optical system PL forms a first projection image of the pattern in the illumination region IR on a first imaging region ER1 and forms a second projection image of the pattern in the illumination region IR on a second imaging region ER2 that is separated by an interval in the Y direction from the first imaging region ER1. That is, the projection optical system PL, as described below, forms the first imaging region ER1 in which the first projection image of the pattern is formed on the sheet SH that moves in the −X direction, and forms the second imaging region ER2 in which the second projection image of the pattern is formed on the sheet SH that moves in the +X direction.

The projection optical system PL is telecentric to the mask M side and the sheet SH side, and has a magnifying power from the mask M side to the sheet SH side. The shape of the imaging regions ER1 and ER2 is a shape that magnifies the shape of the illumination region IR by the projection magnification $\beta$ of the projection optical system PL. Hereinbelow, in order to simplify comprehension of the description, the illumination region IR is assumed to be a region of an elongated rectangular shape along the X direction. In this case, as described below, the first imaging region ER1 and the second imaging region ER2 become regions of an elongated rectangular shape along the Y direction that is perpendicular to the X direction that is the lengthwise direction of the illumination region IR. However, the shape of the illumination region IR, and by extension the shape of the imaging regions ER1 and ER2, are variably set corresponding to the shape of the variable opening portion (light transmission portion) of the mask blind 23 in the illumination optical system IL The mask M is adsorptively held on the mask stage MS via a mask holder (not illustrated). A mask side laser interferometer (not illustrated) which has a well-known constitution is arranged on the mask stage MS. The mask-side laser interferometer measures the position in the X direction and the position in the Y direction of the mask stage MS, and the rotation angle about the Z axis, and supplies the measuring result to main control system CR. The main control system CR, based on the measurement value, controls via the drive system DR the position in the X direction of the mask stage MS, the position and speed in the Y direction as the scan direction, and the rotation angle about the Z axis.

Figure 2:
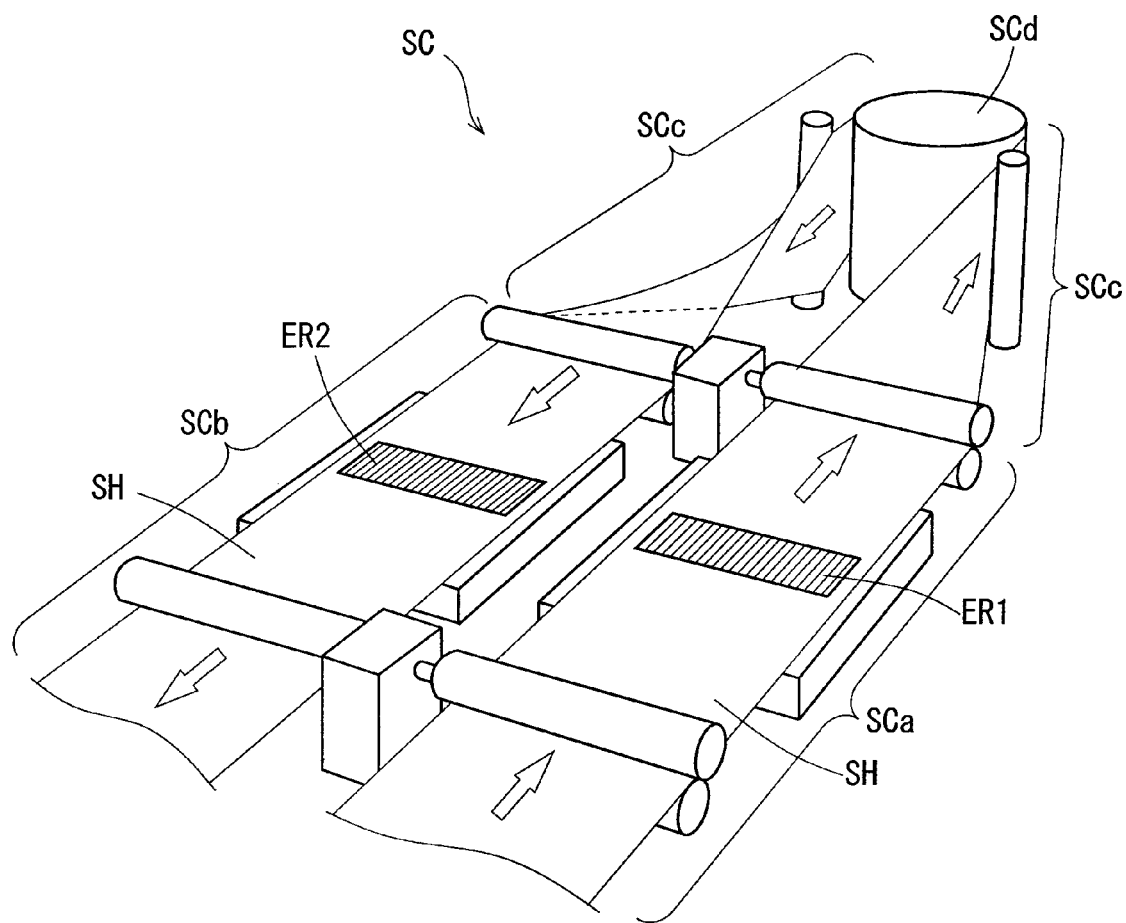
FIG. 2 is a drawing that schematically shows the essential elements of the moving mechanism that conveys the belt-shaped photosensitive substrate by roll-to-roll.

The sheet SH is conveyed along a predetermined path by the working of the moving mechanism SC that is provided with a series of rolls. As shown in FIG. 2, the moving mechanism SC has a first straight path SCa that extends in a straight line shape along the X direction, a second straight path SCb that extends in a straight line shape along the X direction separated by an interval in the Y direction from the first straight path SCa, and an inverted path SCc that connects the first straight path SCa and the second straight path SCb. The belt-shape sheet SH that has flexibility, after moving in the heading of the −X direction along the first straight path SCa, advances to the inverted path SCc. The first imaging region ER1 is formed on the sheet SH that moves in the heading of the −X direction along the first straight path SCa.

The sheet SH that has entered the inverted path SCc, after passing the inverted roll SCd that is disposed in the center of the inverted path SCc and that rotates centered on an axial line that extends in the Z direction, enters the second straight path SCb. The sheet SH that has entered the second straight path SCb moves in the heading of the +X direction. The second imaging region ER2 is formed on the sheet SH that moves in the heading of the +X direction along the second straight path SCb. During scanning and exposure, in synchronization with the mask stage MS being driven at velocity V/β in the heading of the +Y direction, the sheet SH is made to move at velocity V in the heading of the −X direction in the first straight path SCa and the sheet SH is made to move at velocity V in the heading of the +X direction in the second straight path SCb.

Figure 3:
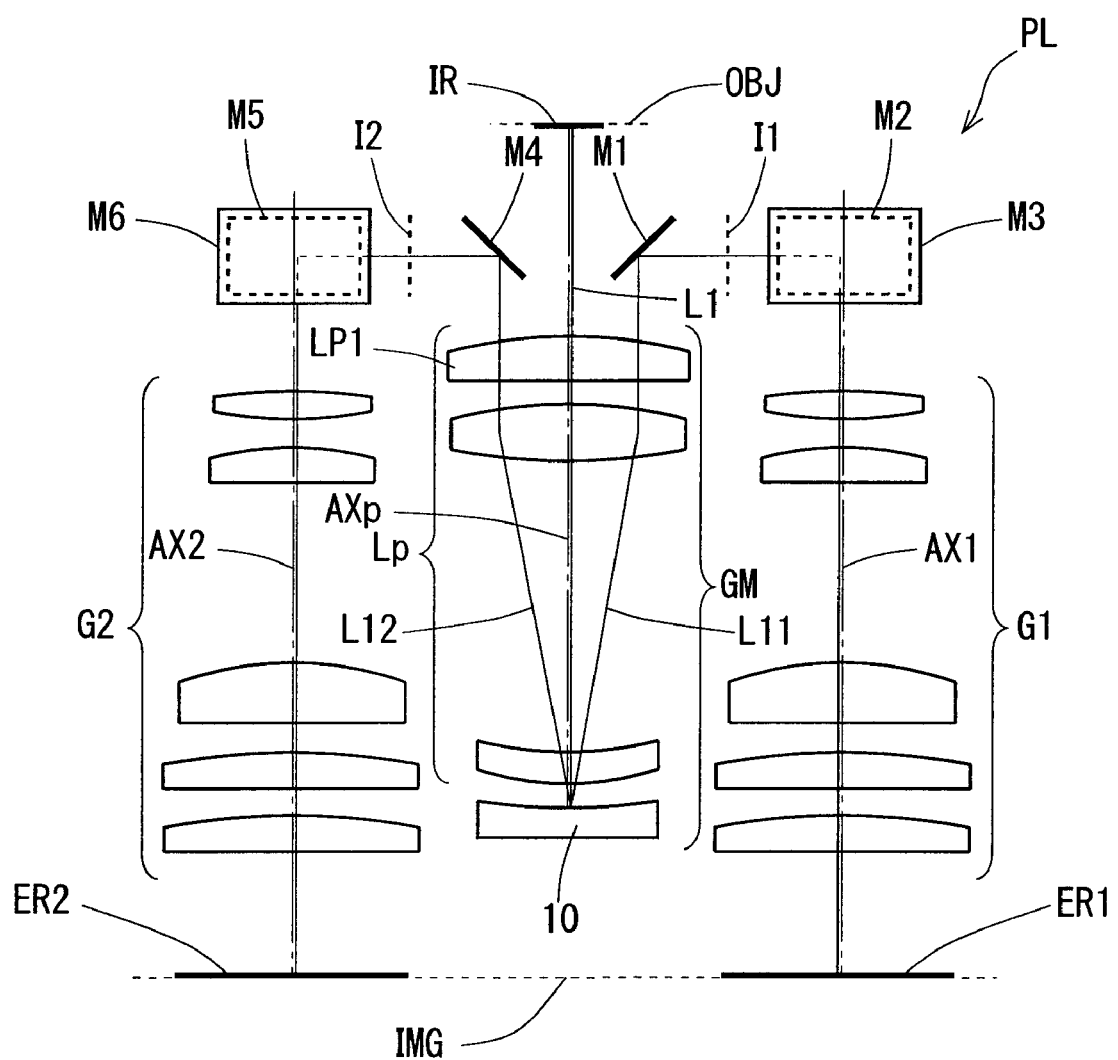
FIG. 3 is a drawing that schematically shows the constitution of the projection optical system of the present embodiment.
Figure 3:
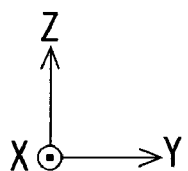

FIG. 3 is a drawing that schematically shows the constitution of the projection optical system of the present embodiment. Referring to FIG. 3, the projection optical system PL has an intermediate imaging optical system GM that forms a first intermediate image I1 and a second intermediate image I2 of the pattern that is illuminated by the illumination region IR in the pattern region of the mask M, a first imaging optical system G1 that forms a first projection image of the pattern in the first imaging region ER1 on the sheet SH based on the light from the first intermediate image I1, and a second imaging optical system G2 that forms a second projection image of the pattern in the second imaging region ER2 on the sheet SH based on the light from the second intermediate image I2.

That is, the intermediate imaging optical system GM makes optically conjugate the position of the pattern region of the mask M and the formation position of the first intermediate image I1 and the formation position of the second intermediate image I2. The first imaging optical system G1 makes optically conjugate the formation position of the first intermediate image I1 and the position of the first imaging region ER1, and forms the first projection image of the pattern in the first imaging region ER1 on the sheet SH that moves in the −X direction along the first straight path SCa. The second imaging optical system G2 makes optically conjugate the formation position of the second intermediate image I2 and the position of the second imaging region ER2, and forms the second projection image of the pattern in the second imaging region ER2 on the sheet SH that moves in the +X direction along the second straight path SCb.

The mask M is arranged on the mask stage MS so that the pattern region may be mostly in agreement with the object surface OBJ of the projection optical system PL. The sheet SH is conveyed by the moving mechanism SC along a track whose surface (photosensitive surface) mostly corresponds with the image plane IMG of the projection optical system PL. The intermediate imaging optical system GM has a positive lens group Lp that light from the pattern region that is illuminated by the illumination region IR enters, and a splitting and reflecting portion 10 that splits light from the positive lens group Lp into a first light and a second light that advance in mutually separate directions that sandwich the optical axis AXp of the positive lens group Lp and reflects the first light and the second light toward the positive lens group Lp. The specific constitution and action of the splitting and reflecting portion 10 shall be described below.

In the optical path between the intermediate imaging optical system GM and the first imaging optical system G1, a first deflecting member M1, a second deflecting member M2, and a third deflecting member M3 are arranged in the order of incidence of light. In the optical path between the intermediate imaging optical system GM and the second imaging optical system G2, a fourth deflecting member M4, a fifth deflecting member M5, and a sixth deflecting member M6 are arranged in the order of incidence of light. The deflecting members M1 to M6 are, for example, reflecting mirrors that have a planar reflecting surface. Hereinbelow, in order to simplify understanding of the constitution of the projection optical system PL, the action of the deflecting members M1 to M6 shall be described, focusing on light L1 that is emitted along the optical axis AXp from the illumination region IR.

Referring to FIG. 3, the light L1 that is emitted along the optical axis AXp from the illumination region IR passes through the positive lens group Lp and is then reflected by the splitting and reflecting portion 10, and is split into a first light L11 that advances in a diagonal upper-right heading (first heading) and a second light L12 that advances in a diagonal upper-left heading (second heading) in the page surface of FIG. 3. The first light L11 that is reflected by the splitting and reflecting portion 10 enters the deflecting member M1 along the +Z direction after passing through the positive lens group Lp, and it is deflected in the +Y direction by the deflecting member M1.

Figure 4:
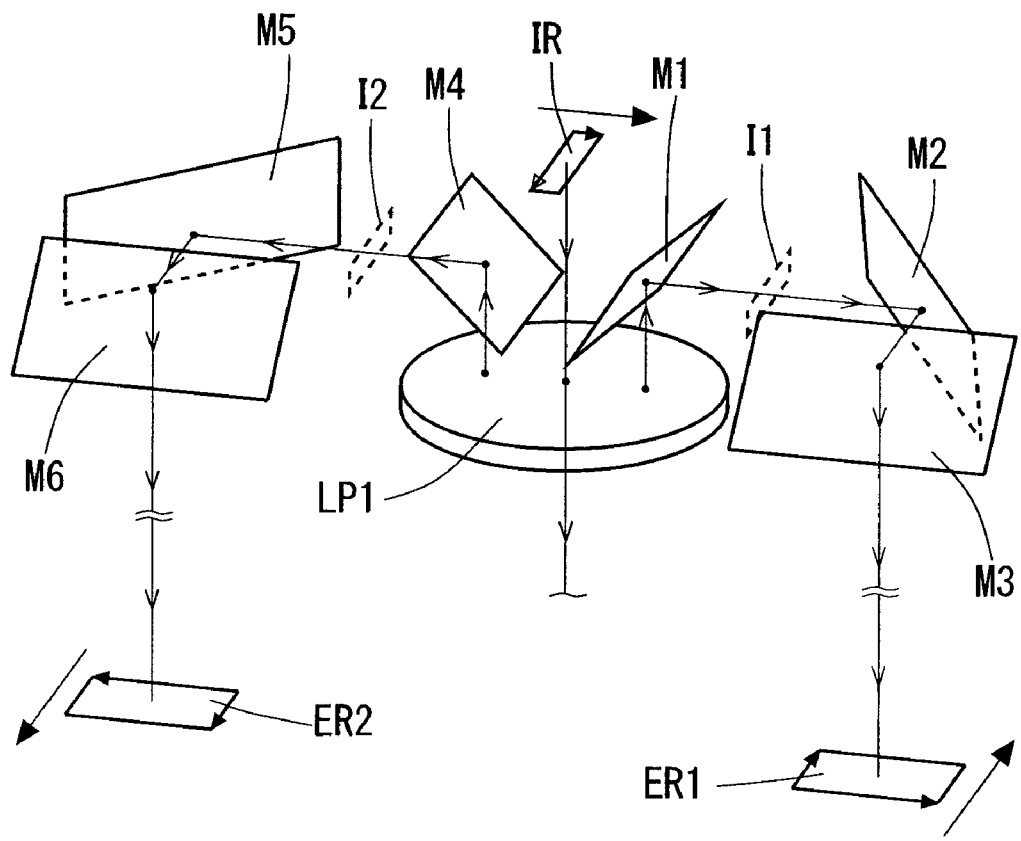
FIG. 4 is a drawing that describes the operation of the group of deflecting members.

The first light L11 that is deflected in the +Y direction by the deflecting member M1 forms, as the first intermediate image I1, for example an image of nearly equal magnification of the mask pattern. The first light that advances along the +Y direction from the first intermediate image I1, as shown in FIG. 4, after being deflected in the +X direction by the deflecting member M2 and deflected in the −Z direction by the deflecting member M3, reaches the first imaging region ER1 on the sheet SH that moves in the −X direction along the first straight path SCa via the first imaging optical system G1. A magnified image of the mask pattern is formed as the first projection image in the first imaging region ER1 having an elongated rectangular shape along the Y direction. Note that FIG. 4 shows only the lens LP1 that is disposed closest to the mask side, among the positive lens group Lp.

The second light L12 that is reflected by the splitting and reflecting portion 10, after passing through the positive lens group Lp, enters the deflecting member M4 along the +Z direction, and it is deflected in the −Y direction by the deflecting member M4. The second light L12 that is deflected in the −Y direction by the deflecting member M4 forms an image of nearly equal magnification of the mask pattern similarly to the first intermediate image I1. The second light that advances along the −Y direction from the second intermediate image I2, as shown in FIG. 4, after being deflected in the +X direction by the deflecting member M5 and deflected in the −Z direction by the deflecting member M6, reaches the second imaging area ER2 on the sheet SH that moves in the +X direction along the second straight path SCb via the second imaging optical system G2. A magnified image of the mask pattern is formed as the second projection image in the second imaging region ER2 having an elongated rectangular shape along the Y direction.

The first projection image and the second projection image have a shape that magnifies the mask pattern by projection magnification β of the projection optical system PL. Then, as clearly shown in FIG. 4, the first projection image is formed with an orientation that rotates the mask pattern +90 degrees about the Z-axis, and the second projection image is formed with an orientation that rotates the mask pattern −90 degrees. That is, the first projection image and the second projection image have the same shape and size, but are mutually reversed in relation to the X direction and the Y direction.

Figure 5:
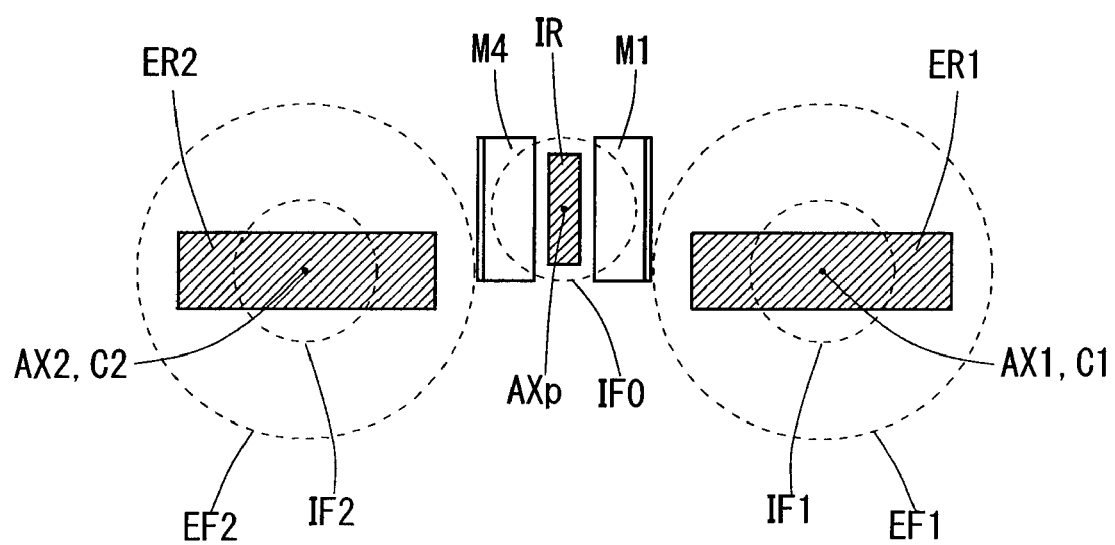
FIG. 5 is a drawing that shows the appearance of the first imaging region and the second imaging region that are formed in a row.
Figure 5:
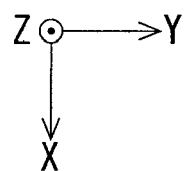

In the projection optical system PL, as shown in FIG. 5, the position C1 of a light beam that is emitted from the illumination region IR along the optical axis AXp and deflected in the −Z direction by the third deflecting member M3 and the optical axis AX1 of the first imaging optical system G1 agree, and the position C2 of a light beam that is emitted from the illumination region IR along the optical axis AXp and deflected in the −Z direction by the sixth deflecting member M6 and the optical axis AX2 of the second imaging optical system G2 agree. As a result, the first imaging region ER1 and the second imaging region ER2 are formed in a row in the Y direction. Note that in FIG. 5, the dashed line circle IF0 shows the incidence side visual field of the projection optical system PL, the dashed line circles IF1 and IF2 show the entry side visual field of the imaging optical systems G1 and G2, and the dashed line circles EF1 and EF2 show the emission side visual field of the imaging optical systems G1 and G2.

Figure 6:
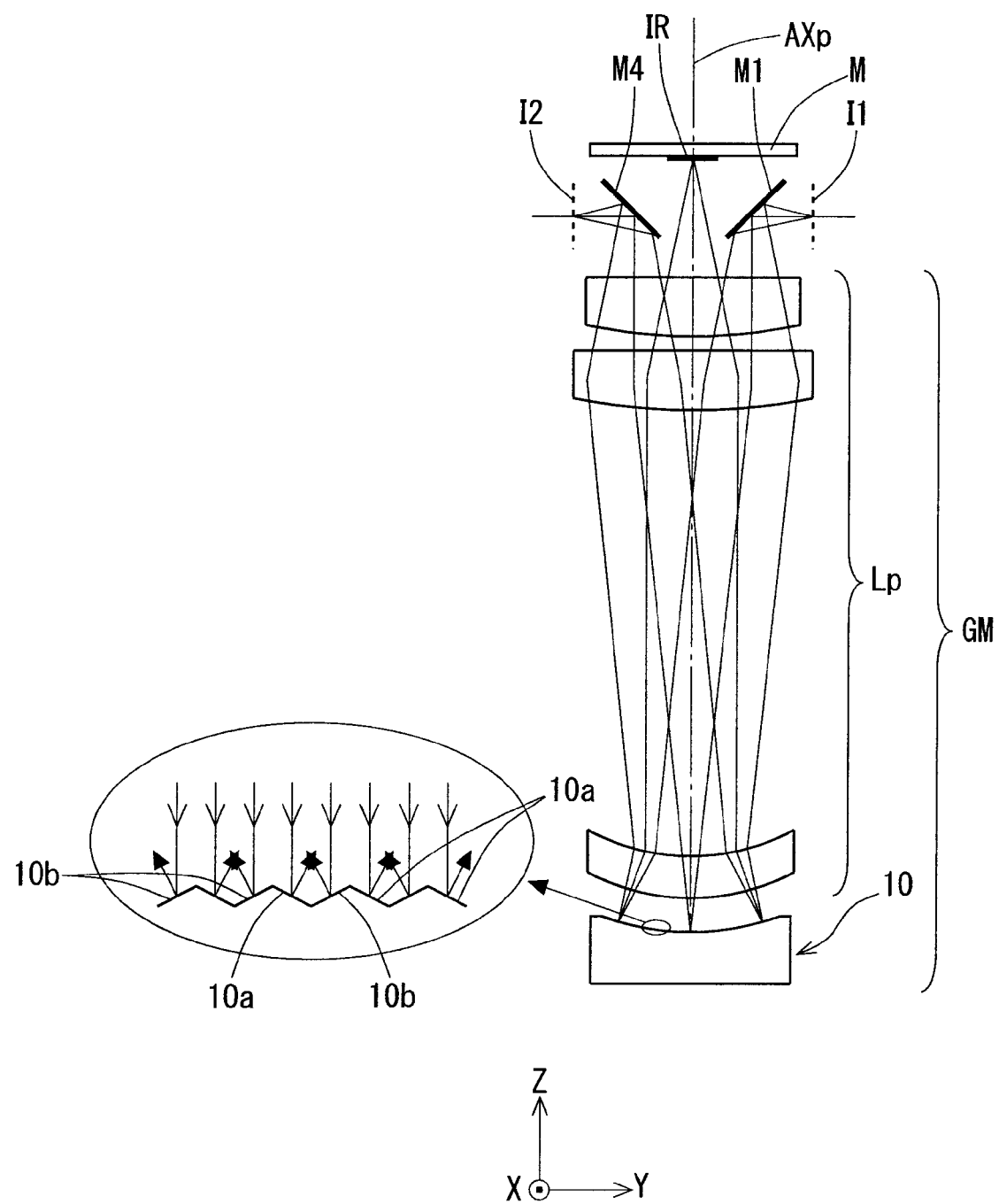
FIG. 6 is a drawing that describes the constitution and operation of the splitting and reflecting portion in the present embodiment.

The splitting and reflecting portion 10 has a plurality of first reflecting portions 10a and a plurality of second reflecting portions 10b arranged at the focal position of the positive lens group Lp or in the vicinity thereof, as shown in FIG. 6. Here, the focal position of the positive lens group Lp is the position at which the parallel beams are condensed (that is, the rear focal position), in the case of parallel light beams being input from the mask M side to the positive lens group Lp. The first reflecting portion 10a and the second reflecting portion 10b are arranged over a concave curved surface (for example, a spherical surface) facing the positive lens group Lp, and are alternately provided in the Y direction. Alternatively, the first reflecting portion 10a and the second reflecting portion part 10b are arranged along a surface that is parallel to the XY plane, and are alternately provided along the Y direction. The first reflecting portion 10a, for example, has a plane-shaped reflecting surface, and the normal that extends from the reflecting surface thereof to the outer side faces diagonally upward to the right in FIG. 6. The second reflecting portion 10b, for example, has a plane-shaped reflecting surface, and the normal that extends from the reflecting surface thereof to the outer side faces diagonally upward to the left in FIG. 6.

Accordingly, the light that entered the first reflecting portion 10a parallel with the optical axis AXp of the positive lens group Lp (by extension, the optical axis of the intermediate imaging optical system GM) is reflected diagonally upward to the right in FIG. 6 by the reflecting surface thereof. The light that is reflected by the plurality of first reflecting portions 10a turns into the above-mentioned first light, and passes through the positive lens group Lp and the first deflecting member M1 to form the first intermediate image I1. On the other hand, the light that entered the second reflecting portion 10b parallel with the optical axis AXp is reflected diagonally upward to the left in FIG. 6 by the reflecting surface thereof. The light that is reflected by the plurality of second reflecting portions 10b turns into the above-mentioned second light, and passes through the positive lens group Lp and the fourth deflecting member M4 to form the second intermediate image I2. That is, in the splitting and reflecting portion 10, the first reflecting portions 10a generate the first light by reflecting the light that entered from the positive lens group Lp diagonally upward to the right in FIG. 6, and the second reflecting portions 10b generate the second light by reflecting the light that entered from the positive lens group Lp diagonally upward to the left in FIG. 6.

Figure 7:
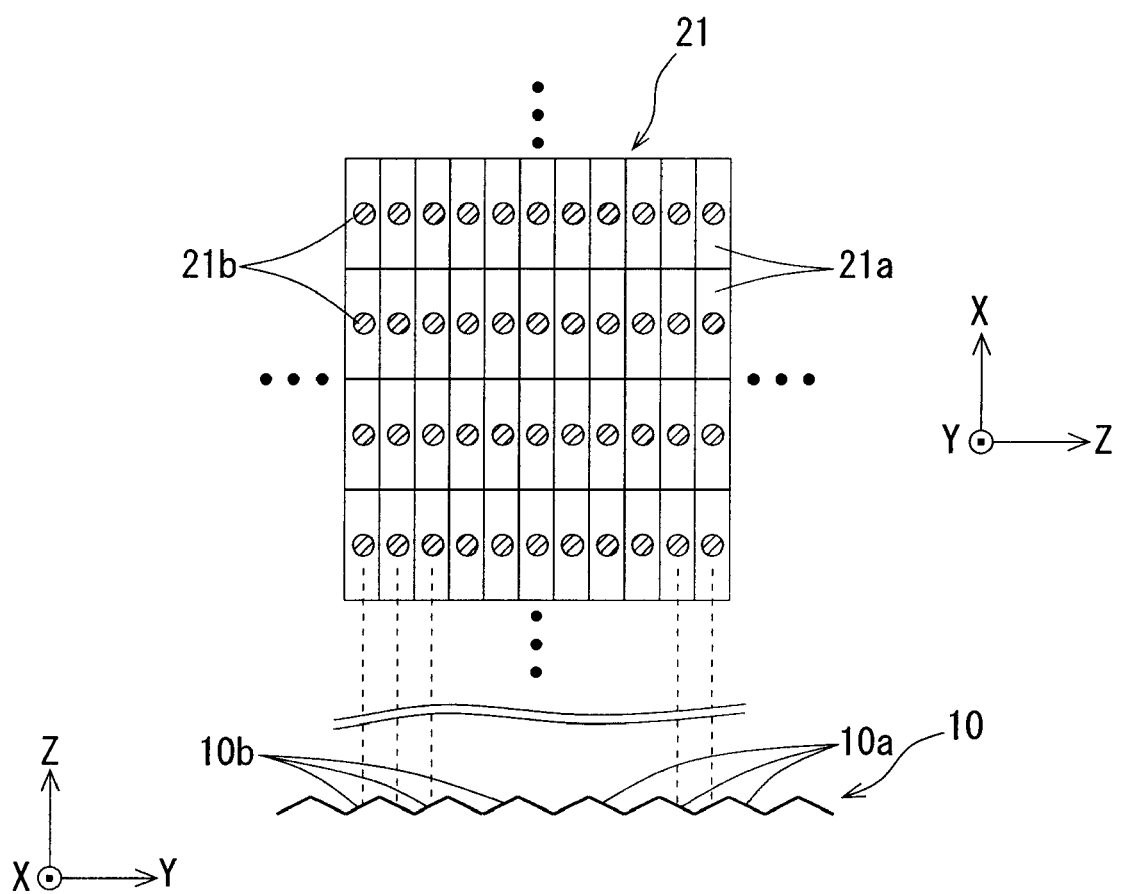
FIG. 7 is a drawing that describes the correspondence relationship of the plurality of reflecting portions of the splitting and reflecting portion and the plurality of light sources in the illumination pupil.

Note that the reflecting portions 10a and 10b of the splitting and reflecting portion 10 are arranged at the rear focal position of the positive lens group Lp or in the vicinity thereof (that is, the pupil position of the projection optical system PL or the vicinity thereof), and as a result are arranged at an optically conjugate position with the rear focal position of the fly-eye lens 21 in the illumination optical system IL (that is, the position of the illumination pupil of the illumination optical system IL) or in the vicinity thereof. The fly-eye lens 21 is an optical element that consists of a plurality of lens elements 21a having positive refractive power that are, for example, arranged vertically and horizontally and densely, as shown in the upper side of FIG. 7. Each lens element 21a, corresponding to the rectangular illumination region IR with an elongated rectangular shape in the X direction, has a cross-sectional shape with a similarly elongated rectangular shape in the X direction. The rectangular plane of incidence of each lens element 21a constitutes a unit wavefront splitting surface of the fly-eye lens 21 as a wavefront splitting type optical integrator.

The flux of light that has entered the fly-eye lens 21 is split in a two-dimension manner by the plurality of lens elements 21a, and forms one light source 21b at the rear focal surface of each lens element 21a (and by extension, the rear focal plane of the fly-eye lens 21) or the vicinity thereof. In the exposure apparatus of the present embodiment, with a substantially planar light source that consists of a plurality of light sources 21b that are formed on the illumination pupil at the rear focal plane of the fly-eye lens 21 or the vicinity thereof serving as a secondary light source, the mask M (and by extension the sheet SH that is arranged at the image plane of the projection optical system PL) that is arranged in the irradiated surface of the illumination optical system IL (the object surface of the projection optical system PL) is Koehler-illuminated.

In this way, the images of the plurality of light sources 21b are formed on the reflecting surfaces of the plurality of reflecting portions 10a and 10b of the splitting and reflecting portion 10 that is disposed at the rear focal position of the positive lens group Lp or the vicinity thereof. In order to increase the reflection efficiency in the reflecting portions 10a and 10b of the splitting and reflecting portion 10, it is preferably constituted so that the images of the plurality of light sources 21b are formed in one row in the X direction on the reflecting surface of the reflecting portions 10a and 10b. In other words, the illumination optical system IL preferably forms a plurality of light sources 21b corresponding to the arrangement of the plurality of first reflecting portions 10a and the plurality of second reflecting portions 10b. Also, using a different expression, the reflecting portions 10a and 10b preferably have a reflecting region of a size that encloses the conjugate image on the reflecting portions 10a and 10b of the light source 21b.

Figure 8:
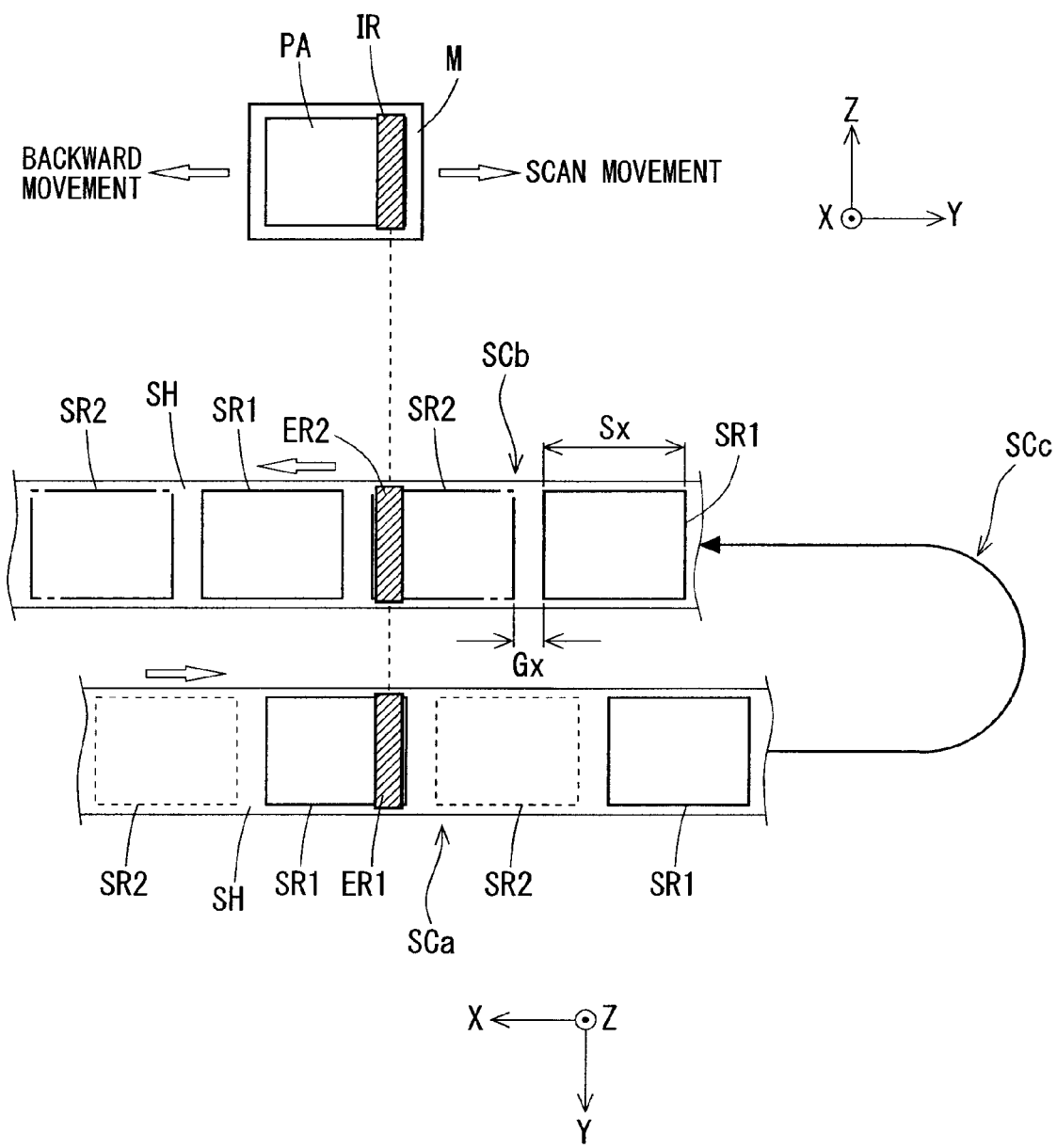
FIG. 8 is a drawing that describes the scanning and exposure operation in the present embodiment.

Hereinbelow, referring to FIG. 8, the operation of scanning and exposure in the present embodiment shall be described. Referring to FIG. 8, a rectangular pattern area PA in which, for example, a circuit pattern of, for example, a display panel is formed is provided on the mask M. In the present embodiment, the sheet S that is a belt-shaped (strip-shaped) photosensitive substrate is conveyed at a constant speed along a predetermined path by the operation of the moving mechanism SC. Then, rectangular shot regions SR1 and SR2 that are enlargements of the pattern region PA of the mask M by the projection magnification β of the projection optical system PL are formed in turn at a fixed interval on the sheet SH.

In FIG. 8, a shot region in which the pattern of the mask M is to be transferred or has been transferred via the first imaging optical system G1 of the projection optical system PL is expressed by reference numeral SR1, and a shot region in which the pattern of the mask M is to be transferred or has been transferred via the second imaging optical system G2 is expressed by reference numeral SR2. The shot region SR1 and the shot region SR2, as described below, are alternately formed along the lengthwise direction of the sheet SH. The dimension of each shot region SR1 and SR2 along the lengthwise direction of the sheet SH is Sx, and the interval between a mutually adjacent pair of shot regions SR1 and SR2 is Gx. Also, in order to simplify understanding of the description of the scanning and exposure operation, the Y direction that is the scan movement direction of the mask M and the X direction that is the scan movement direction of the sheet SH are made to agree in the horizontal direction of the paper surface of FIG. 8.

In the present embodiment, the pattern of the mask M is scanned and exposed on the shot region SR1 that passes directly under the first imaging optical system G1 of the projection optical system PL, that is, the shot region SR1 on the sheet SH that moves in the −X direction along the first straight path SCa. Also, the pattern of the mask M is scanned and exposed on the shot region SR2 that passes directly under the second imaging optical system G2 of the projection optical system PL, that is, the shot region SR2 on the sheet SH that moves in the +X direction along the second straight path SCb, simultaneously with the scanning and exposing to the shot region SR1 in the first straight path SCa.

Specifically, during the simultaneous scanning and exposing to the pair of shot regions SR1 and SR2, the mask M (and by extension the mask stage MS) is moved at a required speed in the +Y direction so that the pattern area PA is scanned by the illumination region IR, from a start position at which the illumination region IR is positioned at the edge portion on the +Y direction side of the pattern area PA until a completion position at which it reaches the edge portion on the −Y direction side. In synchronization with the movement of the mask M in the +Y direction, the sheet SH moves in the −X direction along the first straight path SCa so that the shot region SR1 is scanned by the first imaging region ER1, from a start position at which the first imaging region ER1 is positioned at the edge portion on the −X direction side of the shot region SR1 to a completion position at which it reaches the edge portion on the +X direction side.

Also, in synchronization with the scan movement of the mask M in the +Y direction, the sheet SH moves in the +X direction along the second straight path SCb so that the shot region SR2 is scanned by the second imaging region ER2, from a start position at which the second imaging region ER2 is positioned at the edge portion on the +X direction side of the shot region SR2 to a completion position at which it reaches the edge portion on the −X direction side. That is, in synchronization with the scanning of the pattern area PA by the illumination region IR, the scanning and exposure to the shot region SR1 and the scanning and exposure to the shot region SR2 are performed in parallel and simultaneously. Stated in other words, while the mask M is being moved in the heading of the +Y direction, the first projection image and the second projection image of the pattern of the mask M are respectively formed on the shot regions SR1 and SR2.

Next, the mask M is backward moved in the −Y direction so that the illumination region IR moves from the edge portion at the −Y direction side of the pattern area PA to the edge portion at the +Y direction side of the pattern area PA, that is, so that the illumination region IR returns from the end position to the start position of the scan exposure. During the backward movement of the mask M in the −Y direction, for example a shutter (not illustrated) for blocking the image forming flux is inserted in the light path immediately after the mask M, so that the projection image of the mask pattern is not formed in the imaging regions ER1 and ER2. Alternatively, by closing the variable opening portion of the mask blind 23 in the illumination optical system IL, the projection image of the mask pattern may not be formed in the imaging regions ER1 and ER2.

As a result, during the backward movement of the mask M, in the first straight path SCa, the shot region SR2, which is the shot region following the shot region SR1 immediately after scanning and exposure is completed and is set for transfer of the second projection image of the mask pattern, passes directly under the first imaging optical system G1 without undergoing scanning and exposure. In FIG. 8, the shot region SR1 during scanning and exposure and the shot region SR1 after scanning and exposure in the first straight path SCa are shown by solid lines, and the shot region SR2 that is to pass directly under the first imaging optical system G1 without undergoing scanning and exposure and the shot region SR2 that has passed directly under the first imaging optical system G1 without undergoing scanning and exposure are shown by broken lines.

Similarly, during the backward movement of the mask M, in the second straight path SCb, the shot region SR1, which is the shot region following the shot region SR2 immediately after scanning and exposure is completed and to which the first projection image of the mask pattern has already been transferred, passes directly under the second imaging optical system G2 without undergoing scanning and exposure. In FIG. 8, the shot region SR2 during scanning and exposure and the shot region SR2 after scanning and exposure in the second straight path SCb are shown by dashed dotted lines, and the shot region SR1 that is to pass directly under the second imaging optical system G2 without undergoing scanning and exposure and the shot region SR1 that has passed directly under the second imaging optical system G2 without undergoing scanning and exposure are shown by solid lines.

At the point in time of the backward movement in the −Y direction of the mask M being completed and the illumination region IR having returned to the start position on the +Y direction side of the pattern area PA so that scan movement in the +Y direction of the mask M has become possible, the shutter immediately after the mask M is retracted from the optical path, and the first imaging region ER1 is formed at the start position on the −X direction side of the shot region SR1 that is to be next scanned and exposed, and the second imaging region ER2 is formed at the start position on the +X direction side of the shot region SR2 that is to be next scanned and exposed. Alternatively, at the point in time in which the backward movement of the mask M is completed, by opening the variable opening portion of the mask blind 23, the imaging regions ER1 and ER2 are formed at the start position of the shot region SR1 and SR2 to be next scanned and exposed.

In this way, in synchronization with the next scan movement of the mask M, the scanning and exposure to the shot region SR1 that passes directly under the first imaging optical system G1, and the scanning and exposure to the shot region SR2 that passes directly under the second imaging optical system G2 are performed simultaneously. Then, by repeating several times the reciprocal movement of the mask M along the Y direction (scan movement and backward movement), the shot region SR1 and the shot region SR2, on which the pattern of the mask M is transferred, are formed one after the other on the sheet SH that moves continuously along a predetermined path.

That is, the shot region SR1 in which the first projection image of the mask pattern is formed via the first imaging optical system G1, and the shot region SR2 in which the second projection image of the mask pattern is formed via the second imaging optical system G2 are mutually adjoined along the lengthwise direction of the belt-shaped sheet SH. In FIG. 8, the turn-back distance along the conveyance path from the center of the first imaging region ER1 to the center of the second imaging region ER2 is an odd-number multiple of the sum (Sx+Gx) of the X-direction dimension Sx and the interval Gx of each shot region. Also, the sum (Sx+Gx) of the X-direction dimension Sx and the interval Gx corresponds to the period of scan movement of the mask M and corresponds to the period of the backward movement of the mask M.

In the projection optical system PL of the present embodiment, the intermediate imaging optical system GM, the group of deflecting members M1 to M3, and the first imaging optical system G1 constitute a first imaging system that forms the first projection image of the pattern of the mask M on the first imaging region ER1 on the sheet SH. The first imaging system (GM, M1 to M3, G1) forms the first imaging region ER1 that is optically conjugate with the illumination region IR that is formed in the pattern region of the mask M by the illumination optical system IL on the sheet SH that moves in the −X direction along the first straight path SCa.

On the other hand, the intermediate imaging optical system GM, the group of deflecting members M4 to M6, and the second imaging optical system G2 constitute a second imaging system that forms the second projection image of the pattern of the mask M on the second imaging region ER2 at an interval in the Y direction from the first imaging region ER1. The second imaging system (GM, M4 to M6, G2) forms the second imaging region ER2 that is optically conjugate with the illumination region IR on the sheet SH that moves in the +X direction along the second straight path SCb at an interval in the Y direction from the first straight path SCa.

In the present embodiment, the portion on the first straight path SCa of the belt-shaped sheet SH (first portion) moves in the −X direction, the portion on the second straight path SCb of the sheet SH (second portion) moves in the +X direction, and the mask M moves in the +Y direction in synchronization with the movement of the sheet SH in the X direction. The pair of imaging regions ER1 and ER2 are respectively formed in a row separated by an interval in the Y direction, which is perpendicular to the X direction that is the scanning direction of the sheet SH, in the first portion on the first straight path SCa of the sheet SH and the second portion on the second straight path SCb of the sheet SH.

Also, as shown in FIG. 4, the first projection image of the pattern of the mask M is formed in the first imaging region ER1 on the sheet SH that moves along the first straight path SCa so as to optically correspond with the +Y direction that is the scanning direction of the mask M and the −X direction that is the moving direction (scanning direction) of the sheet SH in the first straight path SCa. The second projection image of the pattern of the mask M is formed in the second imaging region ER2 on the sheet SH that moves along the second straight path SCb so as to optically correspond with the +Y direction that is the scanning direction of the mask M and the +X direction that is the moving direction of the sheet SH in the second straight path SCb.

In this way, in the exposure apparatus of the present embodiment, by performing a scan movement of the mask M once in the +Y direction, the scanning and exposure of the first projection image to the shot region SR1 on the sheet SH that moves in the −X direction along the first straight path SCa and the scanning and exposure of the second projection image to the shot region SR2 on the sheet SH that moves in the +X direction along the second straight path SCb can be performed simultaneously. Also, by repeating several times the reciprocal movement of the mask M along the Y direction, it is possible to continuously form in an alternating manner the shot region SR1 in which the first projection image of the pattern of the mask M is transferred and the shot region SR2 in which the second projection image is transferred on the sheet SH that continuously moves along a predetermined path. That is, in the exposure apparatus of the present embodiment, it is possible to improve the throughput of scanning and exposure to the belt-shaped sheet SH that is conveyed by roll to roll.

Note that in the aforementioned embodiment, the present invention was described based on the projection optical system PL that has the specific constitution shown in FIG. 2 to FIG. 7. However, regarding the constitution of the projection optical system, various forms are possible. Specifically, in the aforementioned embodiment, the splitting and reflecting portion 10 is used that has the plurality of first reflecting portions 10a and the plurality of second reflection parts 10b that are arranged in a fixed manner at the rear focal position of the positive lens group Lp or in the vicinity thereof. However, it is not limited thereto, and instead of the splitting and reflecting portion 10, as shown in FIG. 9, it is possible to use a spatial optical modulator 11 that has a plurality of mirror elements 11a that are two-dimensionally arranged and whose attitude can be individually changed.

The spatial optical modulator 11 is provided with a plurality of mirror elements 11a that are two-dimensionally disposed at the rear focal position of the positive lens group Lp or the vicinity thereof, a base 11b that holds the plurality of mirror elements 11a, and a drive portion 11c that individually drives the attitude of the plurality of mirror elements 11a via a cable (not illustrated) that is connected to base 11b. The drive portion 11c individually controls the attitude of the plurality of mirror elements 11a in accordance with a command from a main control system CR.

The plurality of mirror elements 11a have for example a plane-shaped reflecting surface, and are arranged along a plane parallel to the XY plane. Alternatively, the plurality of mirror elements 11a are arranged along a concave curved surface (for example, a spherical surface) toward the positive lens group Lp. In the modification of FIG. 9, when simultaneously performing the scanning and exposure to the shot region SR1 and the scanning and exposure to the shot region SR2, the attitudes of the plurality of mirror elements 11a are set to the state shown in the partial detailed drawing A of FIG. 9.

Figure 9:
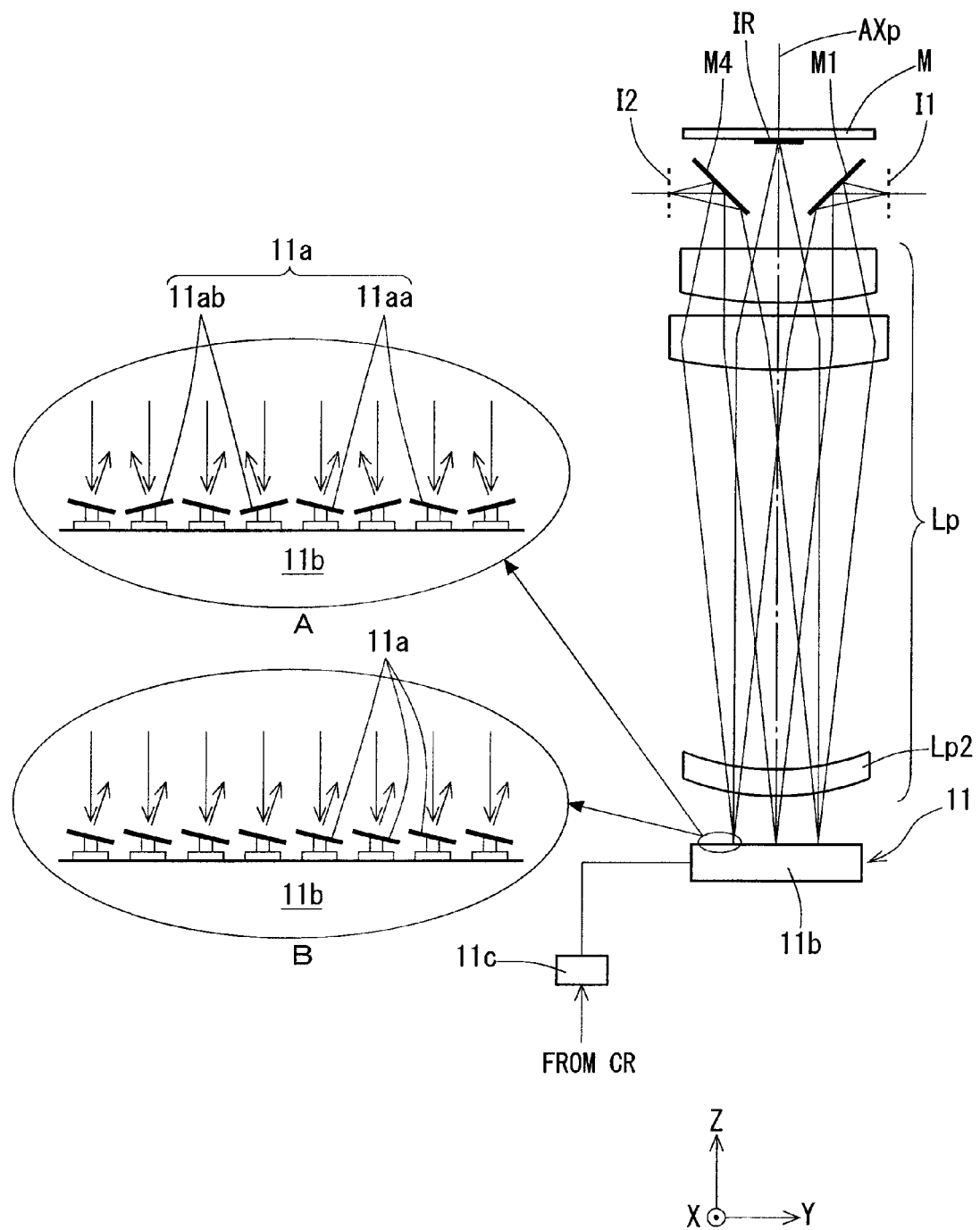
FIG. 9 is a drawing that describes the constitution and operation of the splitting and reflecting portion in the first modification.

In the state that is shown in the partial detailed drawing A, the mirror elements 11 as that are attitude controlled so that the normal that extends from the reflecting surface to the outside faces diagonally upward to the right in FIG. 9, and the mirror elements 11ab that are attitude controlled so that the normal that extends from the reflecting surface to the outside faces diagonally upward to the left in FIG. 9 are set so as to be alternately arranged in the Y direction. Accordingly, the light parallel to the optical axis AXp of the positive lens group Lp that is incident on the mirror elements 11 as serving as a first reflecting portion is reflected diagonally upward to the right in FIG. 9 by the reflecting surfaces thereof. The light that is reflected by the plurality of mirror elements 11 as becomes a first light, and passes through the positive lens group Lp and the first deflecting member M1 to form the first intermediate image I1. The light that is incident on the mirror elements 11ab serving as a second reflecting portion parallel to the optical axis AXp is reflected diagonally upward to the left in FIG. 9 by the reflecting surfaces thereof. The light that is reflected by the plurality of mirror elements 11ab becomes a second light, and passes through the positive lens group Lp and the fourth deflecting member M4 to form the second intermediate image I2.

Also, in the case of performing only scanning and exposure to the shot region SR1 just after the scanning and exposure to the belt-shaped sheet SH, the attitudes of all of the mirror elements 11a are set to the state shown in the partial detailed drawing B of FIG. 9. In the state shown in the partial detailed drawing B, the attitudes of all of the mirror elements 11a are uniformly set so that the normal that extends from the reflecting surface to the outside faces diagonally upward to the right in FIG. 9. In this case, all of the mirror elements 11a function as the first reflecting portion that reflects light that has entered parallel to the optical axis AXp of the positive lens group Lp diagonally upward to the right in FIG. 9. Accordingly, all the light that is reflected by the spatial optical modulator 11 becomes the first light and passes through the positive lens group Lp and the first deflecting member M1 to form the first intermediate image I1.

Although the illustration is omitted, in the case of performing only scanning and exposure to the shot region SR2 immediately before the completion of scanning and exposure to the belt-shaped sheet SH, the attitudes of all of the mirror elements 11a are uniformly controlled so that the normal that extends from the reflecting surface to the outside faces diagonally upward to the left. In this case, all of the mirror elements 11a function as the second reflecting portion that reflects light that has entered parallel to the optical axis AXp of the positive lens group Lp diagonally upward to the left in FIG. 9. Accordingly, all the light that is reflected by the spatial optical modulator 11 becomes the second light and passes through the positive lens group Lp and the fourth deflecting member M4 to form the second intermediate image I2.

In the modification of FIG. 9, it is possible to individually control the attitude of each mirror element 11a in response to the shape of the optical intensity distribution (pupil intensity distribution) that is for example formed in the illumination pupil at the rear focal plane of the fly-eye lens 21 or the vicinity thereof, and by extension it is possible to suitably change the selection of mirror elements 11a that are used, the selection of the orientation of reflected light from the mirror elements 11a, and the distribution of the quantity of reflected light from the mirror elements 11a. As a result, it is possible for example to adjust the light intensity distribution in the pupil position of the projection optical system PL, finely adjust the formation position of the imaging regions ER1 and ER2, adjust the light quantity distribution at the imaging regions ER1 and ER2, and correct aberration of the projection optical system PL.

Even in the modification of FIG. 9, in order to raise the reflection efficiency in the mirror elements 11a of the spatial optical modulator 11, it is desirable to constitute so that the image of the one light source 21b may be formed on the reflecting surface of each mirror element 11a. As the spatial optical modulator 11, it is possible to use the spatial optical modulator disclosed in Japanese Patent Application Publication No. H10-503300A and the corresponding European Patent Application Publication No. 779530, Japanese Patent Application Publication No. 2004-78136A and the corresponding U.S. Pat. No. 6,900,915, Japanese Patent Application Publication No. 2006-524349A and corresponding U.S. Pat. No. 7,095,546, and Japanese Patent Application Publication No. 2006-113437.

Note that although the intermediate imaging optical system GM is provided with the positive lens group Lp as a lens group which light from the pattern region of the mask M enters, this lens group is not limited to a positive lens group (a lens group having overall positive refractive power), and it is possible to make it a negative lens group (a lens group having overall negative refractive power). For example, this lens group is preferably a positive lens group in the case of the plurality of first reflecting portions 10a and the plurality of second reflecting portions 10b of the splitting and reflecting portion 10 being arranged along a planar surface, and in the case of the plurality of mirror elements 11a of the spatial optical modulator 11 being arranged along a planar surface. Also, for example this lens group is preferably a negative lens group in the case of the plurality of first reflecting portions 10a and the second reflecting portions 10b, or the plurality of mirror elements 11a being arranged along a concave surface facing the intermediate imaging optical system GM, and the lens Lp2 that is most on the rear focal position side of the intermediate imaging optical system GM (refer to FIG. 9) being a concave lens.

Figure 10:
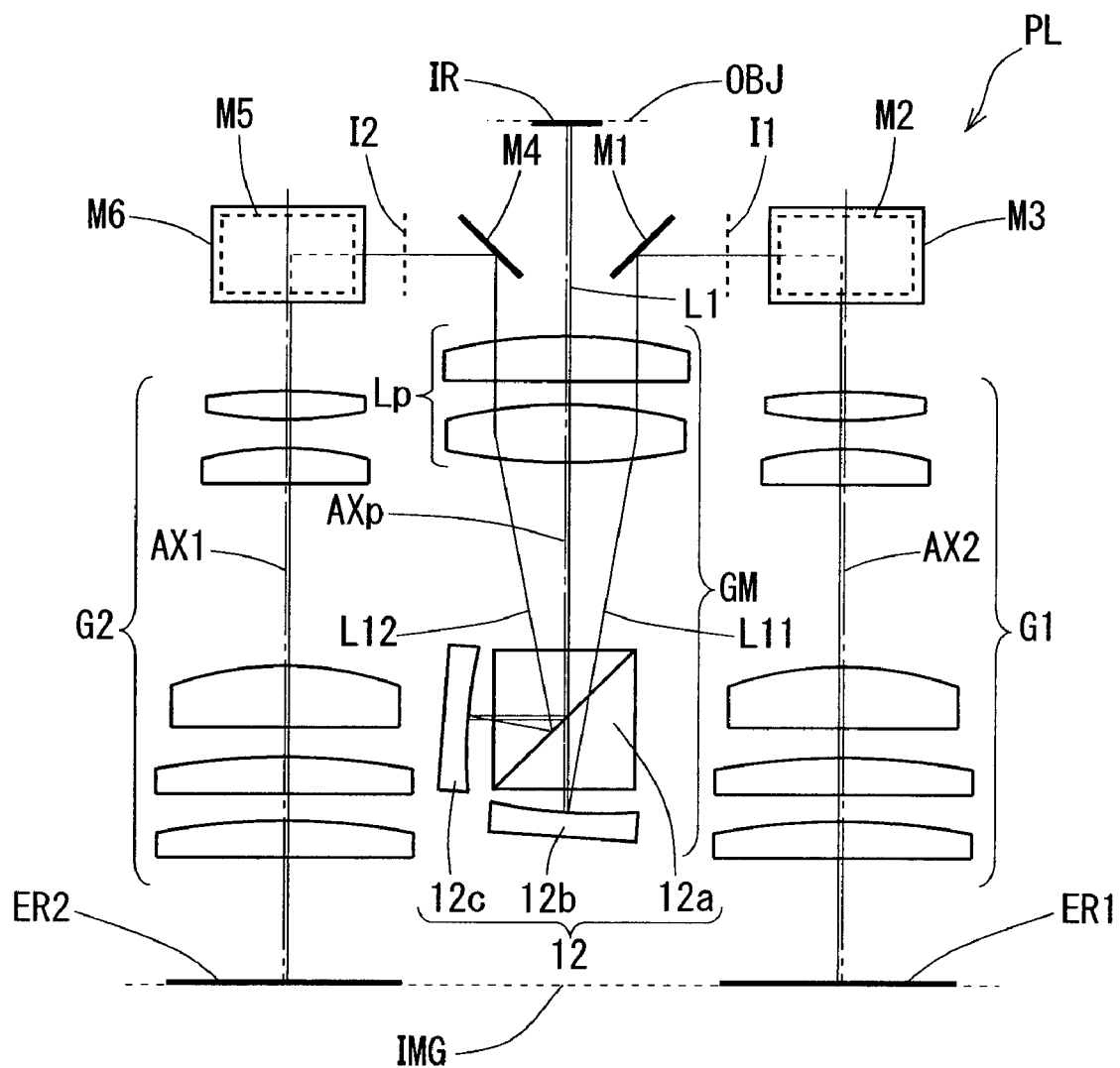
FIG. 10 is a drawing that describes the constitution and operation of the splitting and reflecting portion in the second modification.
Figure 10:
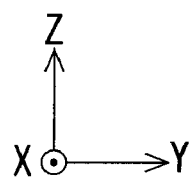

On the other hand, as shown in FIG. 10, in place of the splitting and reflecting portion 10, it is possible to use a splitting and reflecting portion 12 that consists of a polarization beam splitter 12a and a pair of concave reflecting mirrors 12b and 12c. The polarization beam splitter 12a that serves as the splitting portion splits the light L1 from the positive lens group Lp into P polarization transmitted light (first light) L11 and S polarization reflected light (second light) L12. The P polarization light L11 that is transmitted through the polarization beam splitter 12a is reflected by the first concave reflecting mirror 12b that is positioned at the focal position of the positive lens group Lp or in the vicinity thereof, and enters the polarization beam splitter 12a.

As for the P polarization light L11 that has entered the polarization beam splitter 12a, after being transmitted through the polarization beam splitter 12a, it passes through the positive lens group Lp and the first deflecting member M1 to form the first intermediate image I1. On the other hand, as for the S polarization light L12 that is reflected by the polarization beam splitter 12a, it is reflected by the second concave reflecting mirror 12c that is disposed at the focal position of the positive lens group Lp or the vicinity thereof and enters the polarization beam splitter 12a. The S polarization light L12 that has entered the polarization beam splitter 12a, after being reflected by the polarization beam splitter 12a, forms the second intermediate image I2 via the positive lens group Lp and the fourth deflecting member M4.

Note that in place of the constitution of FIG. 10, a constitution is also possible in which the P-polarization light that is transmitted through the polarization beam splitter becomes the second light that forms the second intermediate image I2, and the S-polarization light that is reflected by the polarization beam splitter becomes the first light that forms the first intermediate image I1. In this case, the P-polarization light that is transmitted through the polarization beam splitter, after being reflected by the one concave reflecting mirror, passes through the polarization beam splitter, the positive lens group Lp and the fourth deflecting member M4 to form the second intermediate image I2. The S-polarization light that is reflected by the polarization beam splitter, after being reflected by the other concave reflecting mirror, forms the first intermediate image I1 via the polarization beam splitter, the positive lens group Lp and the first deflecting member M1.

Figure 11:
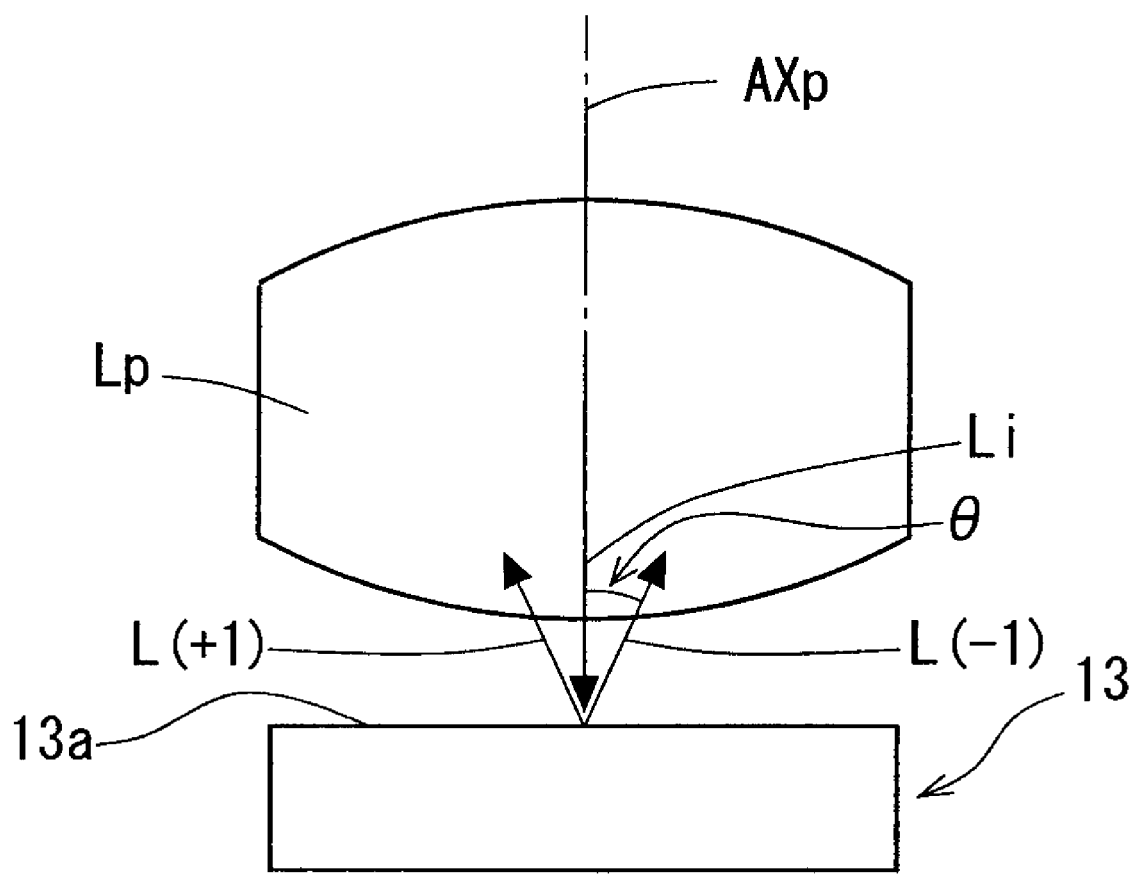
FIG. 11 is a drawing that describes the constitution and operation of the splitting and reflecting portion in the third modification.
Figure 11:
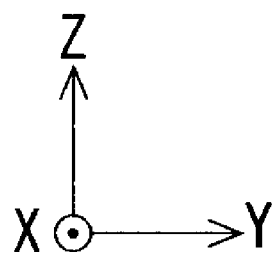

Also as shown in FIG. 11, in place of the splitting and reflecting portion 10, it is possible to use a splitting and reflecting portion 13 that has a reflection-type diffraction grating. The splitting and reflecting portion 13 has a diffraction optical surface 13a that is formed along a plane that is for example parallel to the XY plane (or along a concave curved surface (for example, along a spherical surface) facing the positive lens group Lp). The diffraction optical surface 13a is designed to reflect light Li that is incident along the optical axis AXp of the positive lens group Lp so as to generate +1st order diffracted light L(+1) diagonally upward to the left in FIG. 11 and −1st order diffracted light L(−1) diagonally upward to the right in FIG. 12, while substantially not producing O-order reflected light. That is, it is preferable that the diffraction optical surface 13a be a phase grating that distributes and diffracts most of the incident light to +1st order diffracted light and −1st order diffracted light. Specifically, it is preferable that the diffraction optical surface 13a be a non-planar phase grating, and that the phase difference of each reflected light with the concave portion and convex portion be an odd-number multiple of $\pi/2(=180°)$.

Also, the duty ratio of the concave portions and the convex portions of the diffraction optical surface 13a (the ratio of the width in the arrangement direction (Y direction in FIG. 11) of the concave portions and the convex portions) is preferably approximately 50%. By having the duty ratio be approximately 50%, it is possible to efficiently diffract the +1st order diffracted light L(+1) and the −1st order diffracted light L(−1). Note that the arrangement pitch P of the concave portions (or convex portions) of the diffraction optical surface 13a is between the angle $\theta$ that the +1st order diffracted light L(+1) and the −1st order diffracted light L(−1) form and wavelength $\lambda$, of the light that is incident on the diffraction optical surface 13a and satisfies the relation $\sin \theta = \lambda/P$. For this reason, the arrangement pitch P may be set so that the formed angle $\theta$ is equivalent with the angle formed by the optical axis AXp and the first light L11 (or the second light L12) (refer to FIG. 3).

Also, in the aforementioned embodiment, the first deflecting member M1 is disposed in the optical path between the intermediate imaging optical system GM and the formation position of the first intermediate image I1, the second deflecting member M2 is disposed in the optical path between the formation position of the first intermediate image I1 and the first imaging optical system G1, and the third deflecting member M3 is disposed in the optical path between the second deflecting member M2 and the first imaging optical system G1. Also, the fourth deflecting member M4 is disposed in the optical path between the intermediate imaging optical system GM and the formation position of the second intermediate image I2, the fifth deflecting member M5 is disposed in the optical path between the formation position of the second intermediate image I2 and the second imaging optical system G2, and the sixth deflecting member M6 is disposed in the optical path between the fifth deflecting member M5 and the second imaging optical system G2.

The first deflecting member M1 deflects the first light from the positive lens group Lp in the Y direction that is the scanning direction of the mask M, the second deflecting member M2 deflects the light from the first deflecting member M1 in the X direction that is the scanning direction of the sheet SH, and the third deflecting member M3 deflects the light from the second deflecting member M2 in the Z direction that is parallel to the optical axis AXp of the intermediate imaging optical system GM. Similarly, the fourth deflecting member M4 deflects the second light from the positive lens group Lp in the Y direction, the fifth deflecting member M5 deflects the light from the fourth deflecting member M4 in the X direction, and the sixth deflecting member M6 deflects the light from the fifth deflecting member M5 in the Z direction.

Moreover, the fourth deflecting member M4 deflects light in the opposite direction (−Y direction) to the deflection direction of light by the first deflecting member M1 (+Y direction), the fifth deflecting member M5 deflects light from the fourth deflecting member M4 in the same direction (+X direction) as the deflection direction of light by the second deflecting member M2 (+X direction), and the sixth deflecting member M6 deflects light from the fifth deflecting member M5 in the same direction (−Z direction) as the deflection direction of light by the third deflecting member M3 (−Z direction). However, various forms are possible for the constitution of the first group of deflecting members that is disposed in the optical path between the intermediate imaging optical system GM and the first imaging optical system G1, and the second group of deflecting members that is disposed in the optical path between the intermediate imaging optical system GM and the second imaging optical system G2.

For example, it is possible to constitute the first group of deflecting members with the first deflecting member that deflects the first light from the positive lens group Lp in the X direction that is the scanning direction of the sheet SH, the second deflecting member that deflects the light from this first deflecting member in the Y direction which is the scanning direction of the mask M, and the third deflecting member that deflects the light from this second deflecting member in the Z direction that is parallel to the optical axis AXp of the intermediate imaging optical system GM. Similarly, it is possible to constitute the second group of deflecting members with the fourth deflecting member that deflects the second light from the positive lens group Lp in the X direction, the fifth deflecting member that deflects the light from this fourth deflecting member in the Y direction, and the sixth deflecting member that deflects the light from this fifth deflecting member in the Z direction.

Thus, by constituting the first group of deflecting members so as to deflect the first light from the positive lens group Lp in the Y direction, the X direction and the Z direction in turn, or in the X direction, the Y direction, and the Z direction in turn, it is possible to bring the direction on the first projection image that optically corresponds to the +Y direction on the pattern region of the mask M into agreement with the −X direction. Similarly, by constituting the second group of deflecting members so as to deflect the second light from the positive lens group Lp in the Y direction, the X direction and the Z direction in turn, or in the X direction, the Y direction, and the Z direction in turn, it is possible to bring the direction on the second projection image that optically corresponds to the +Y direction on the pattern region of the mask M into agreement with the +X direction.

That is, it is possible to constitute the first group of deflecting members so as to deflect the first light from the positive lens group Lp in the X direction, the Y direction, and the Z direction in turn, and possible to constitute the second group of deflecting members so as to deflect the second light from the positive lens group Lp in the X direction, the Y direction, and the Z direction in turn. Here, "deflect in turn" means to deflect in each direction one after the other and is not limited to the aforementioned order, and specifically means the order of deflecting in the X direction and deflecting in the Y direction may be replaced. Accordingly, it is possible to have a constitution that deflects in the order of the X direction (Y direction), the Y direction (X direction), and the Z direction coexist in the first group of deflecting members, and a constitution that deflects in the order of the Y direction (X direction), the X direction (Y direction), and the Z direction coexist in the second group of deflecting members.

A constitution is also possible that arranges the lenses constituting a portion of the intermediate imaging optical system GM in the optical path between the first deflecting member M1 and the formation position of the first intermediate image I1, and arranges the lenses constituting a portion of the intermediate imaging optical system GM in the optical path between the fourth deflecting member M4 and the formation position of a second intermediate image I2. In this constitution, a portion and not the entirety of the intermediate imaging optical system GM is in common with the first imaging system and the second imaging system.

Moreover, the foregoing embodiment specifies the shape of the illumination region IR that is formed on the mask M by the operation of the mask blind 23 in the illumination optical system IL, and by extension specifies the shape of the imaging regions ER1 and ER2 that are formed on the sheet SH. However, in place of the mask blind 23, a constitution is also possible that for example arranges a first variable visual field aperture (not illustrated) at the formation position of the first intermediate image I1 or the vicinity thereof, and a second variable visual field aperture (not illustrated) at the formation position of the second intermediate image I2 or the vicinity thereof.

In this case, the shape of the mask-side projection visual field of the projection optical system PL is specified by the first variable visual field aperture and the second variable visual field aperture, and this mask side projection visual field is not necessarily in agreement with the illumination region IR that is formed on the mask M. For example, the illumination region IR is set to a shape that secures a necessary margin region to include the mask-side projection visual field. The first imaging region ER1 that is the first projection visual field on the sheet side of the projection optical system PL is specified as a region that is optically conjugate with the mask-side projection visual field by the first variable visual field aperture. Similarly, the second imaging region ER2 that is the second projection visual field on the sheet side of the projection optical system PL is specified as a region that is optically conjugate with the mask-side projection visual field by the second variable visual field aperture.

Also, further to the mask blind 23, a constitution is also possible that for example disposes the first variable visual field aperture at the formation position of the first intermediate image I1 or the vicinity thereof, and disposes the second variable visual field aperture at the formation position of the second intermediate image I2 or the vicinity thereof. In the constitution that disposes the first variable visual field aperture and the second variable visual field aperture, arrangement of the aforementioned shutter becomes unnecessary, and it is possible to fulfill the shutter function by the opening and closing operation of the opening portion of the first variable visual field aperture and the second variable visual field aperture.

Also, in the foregoing embodiment, the scan direction of the mask M (Y direction) and the scan direction of the sheet SH (X direction) are perpendicular. However, it is not necessary for the scan direction of the mask and the scan direction of the substrate to be perpendicular, and various aspects are possible in accordance with the constitution of the projection optical system.

Also, in the foregoing embodiment, the first straight path SCa and the second straight path SCb are provided in a mutually parallel manner, and so by extension the direction in which the belt-shaped sheet SH moves along the first straight path SCa (−X direction) and the direction in which it moves along the second straight path SCb (+X direction) are opposed. However, it is not necessary for the first straight path and the second straight path to be exactly parallel, and accordingly there is no need for the movement direction of the first portion and the movement direction of the second portion of the belt-shaped sensitive substrate to be exactly oppositely-oriented.

Also, in the foregoing embodiment, the present invention is applied to an exposure apparatus that simultaneously performs scanning and exposure to a first portion and scanning and exposure to a second portion of a belt-shaped sensitive substrate that has flexibility. However, it is not limited thereto, and it is possible to apply the invention similarly to an exposure apparatus that simultaneously performs scanning and exposure to a first substrate that moves in a first heading along a first direction, and scanning and exposure to a second substrate that moves in a second heading opposite to the first heading along the first direction. In this case, the moving mechanism moves the second substrate in the second heading at an interval from the first substrate in a direction that is perpendicular to the first direction. Note that the first substrate and the second substrate may be a substrate of any shape that has flexibility, and may also be a substrate of any shape that does not have flexibility.

Also, the foregoing embodiment applies the present invention to an exposure apparatus in which is mounted a projection optical system PL that has a magnification power. However, it is not limited thereto, and it is possible to similarly apply the present invention to an exposure apparatus that is provided with a projection optical system that has the same magnification or a projection optical system that has a reduction rate.

The exposure apparatus of the foregoing embodiment is manufactured by assembling various sub-systems including each constituent element that is recited in the claims of the present application so as to retain a predetermined mechanical accuracy, electrical accuracy and optical accuracy. In order to ensure these accuracies, adjustment for attaining the optical accuracy in various optical systems, adjustment for attaining mechanical accuracy in various mechanical systems, and adjustment for attaining the electrical accuracy in various electrical systems is performed before and after this assembly. In the assembly from each subsystem to the exposure apparatus, mechanical connections, wiring connections of electrical circuits, and piping connections of air-pressure circuits between various subsystems are included. Prior to the assembly step from each subsystem to the exposure apparatus, it goes without saying that there are assembly steps of each subsystem. When the assembly step of each subsystem to the exposure apparatus is completed, general coordination is performing, and various accuracies are ensured as the entire exposure apparatus. Note that the manufacture of the exposure apparatus is preferably performed in a clean room in which the temperature and the level of cleanness are controlled.

Figure 12:
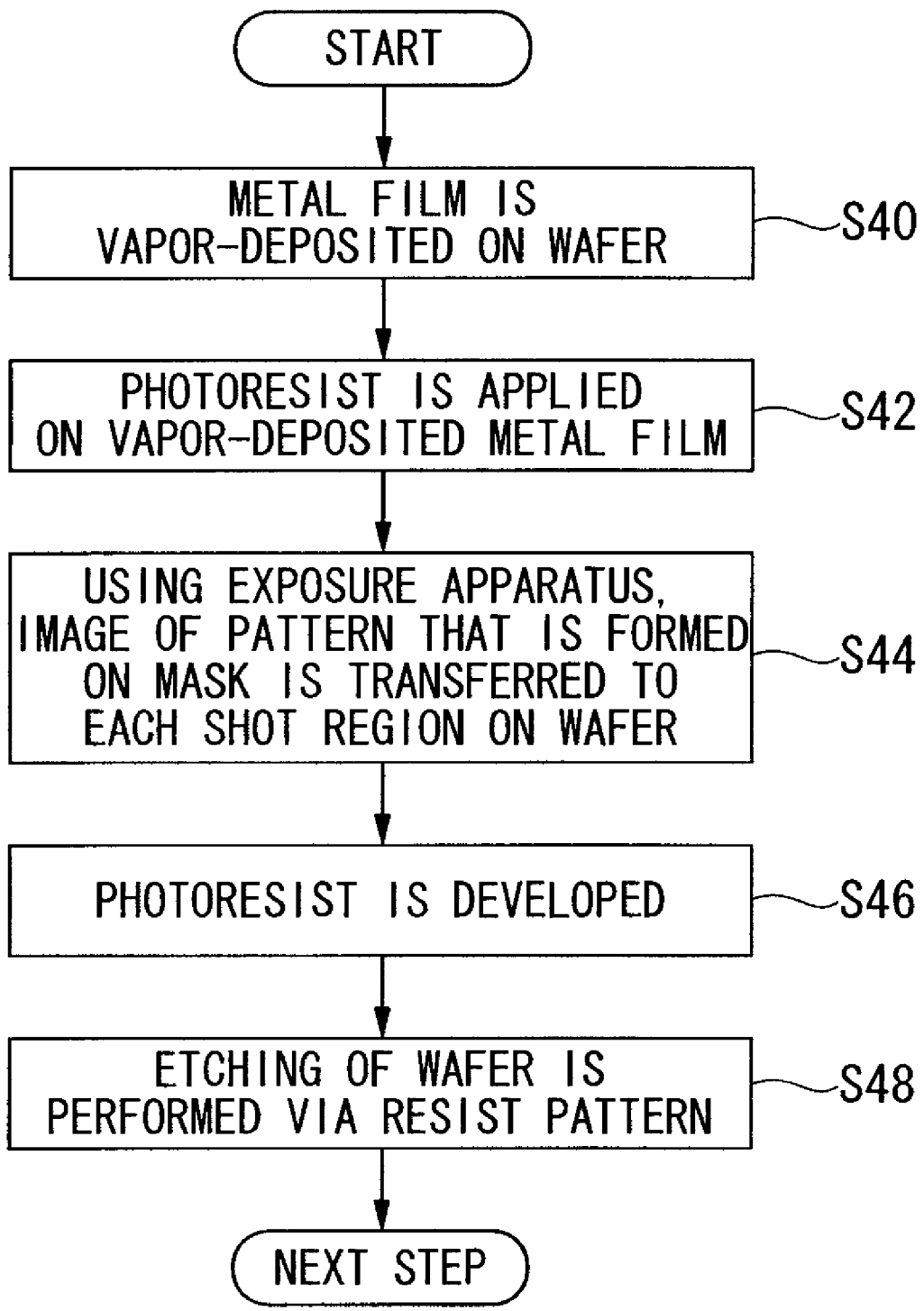
FIG. 12 is a flowchart that shows the manufacturing steps of a semiconductor device.

Using the exposure apparatus of the foregoing embodiment, it is possible to manufacture a semiconductor device and a liquid crystal device or the like. FIG. 12 is a flowchart that shows the manufacturing steps of a semiconductor device. As shown in FIG. 12, the manufacturing steps of the semiconductor device consist of vapor depositing a metallic film on a wafer that that serves as the substrate of the semiconductor device (Step 40) and applying a photoresist made of a photosensitive material on this vapor-deposited metal film (Step S42). Next, using the exposure apparatus of the forgoing embodiment, a pattern that is formed in the mask M is transferred to each shot region on the wafer (Step S44:

exposure step), and developing of the wafer to which the transfer is completed, that is, development of the photoresist to which the pattern has been transferred, is performed (Step S46: developing step).

Then, processing such as etching or the like is performed on the surface of the wafer, with the resist pattern generated on the surface of the wafer by Step S46 serving as a mask for wafer processing (Step S48: processing step). Here, the resist pattern indicates a photoresist layer (transfer pattern layer) in which unevenness is generated of a shape corresponding to the pattern that is transferred by the exposure apparatus of the foregoing embodiment, with the concavities thereof passing through the photoresist layer. In Step S48, surface processing of the wafer is performed by this resist pattern. In the processing that is performed in Step S48, at least one of etching of the surface of the wafer or formation of a metal film is included. Note that in Step S44, the exposure apparatus of the foregoing embodiment performs transfer of the pattern with the wafer on which the photoresist is applied serving as a photosensitive substrate.

Figure 13:
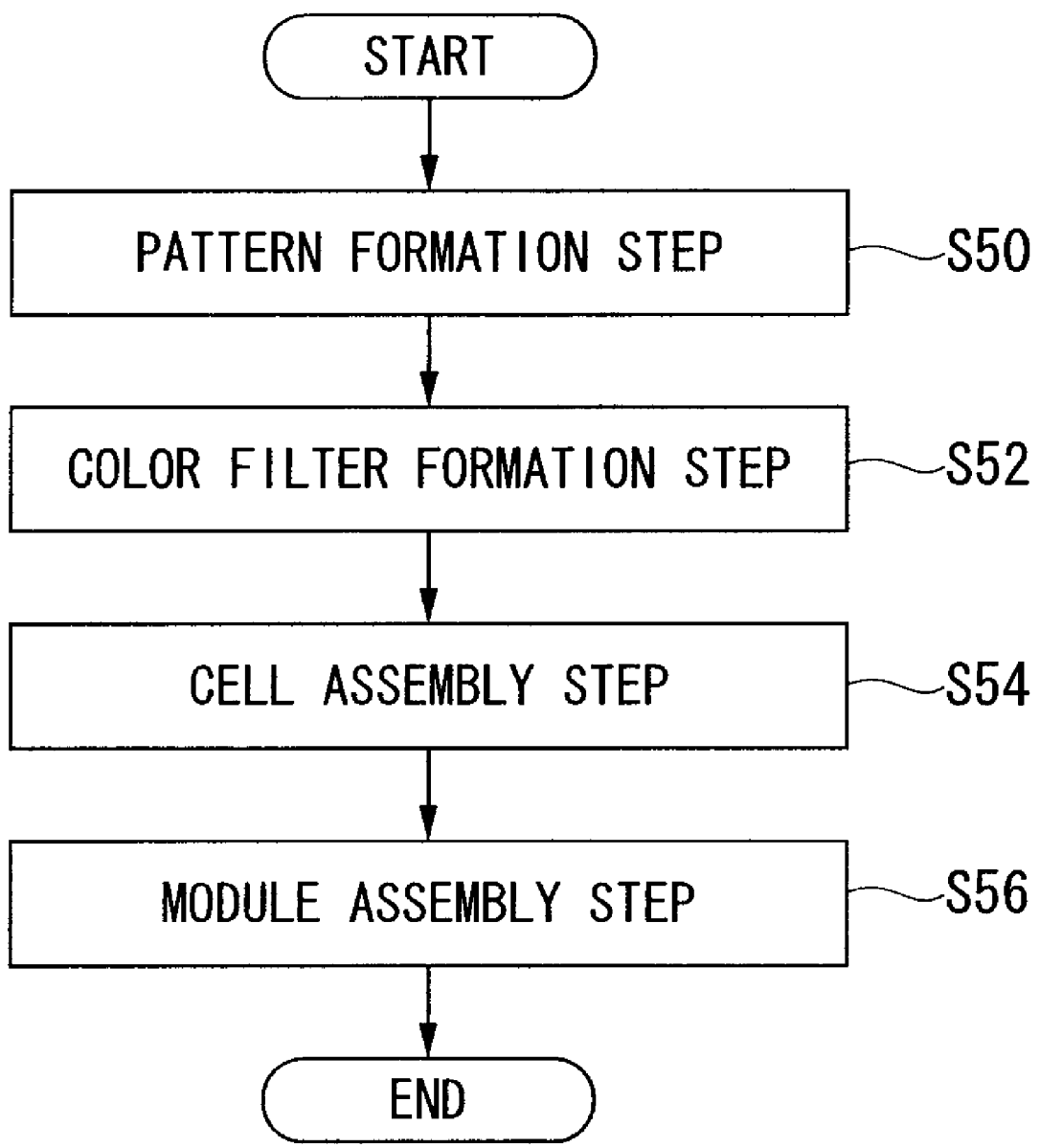
FIG. 13 is a flowchart that shows the manufacturing steps of a liquid crystal device.

FIG. 13 is a flowchart that shows the manufacturing steps of a liquid crystal device such as a liquid crystal display. As shown in FIG. 13, in the manufacturing process of a liquid crystal device, a pattern formation step (Step S50), a color filter formation step (Step S52), a cell assembly step (Step S54) and a module assembly step (Step S56) are sequentially performed. In the pattern formation step of Step S50, a predetermined pattern such as a circuit pattern, an electrode pattern and the like is formed using the exposure apparatus of the foregoing embodiment on a glass substrate on which a photoresist is applied serving as a photosensitive substrate. The pattern forming step includes an exposure step of transferring a pattern onto the photoresist layer by using the exposure apparatus of the foregoing embodiment, a developing step of developing the photosensitive substrate onto which the pattern has been transferred, in other words, developing the photoresist layer on the glass substrate to shape the photoresist layer (transfer pattern layer) in accordance with the pattern, and a processing step of processing the surface of the glass substrate by means of the developed photoresist layer.

In the color filter formation step of Step S52, a large number of sets of three dots corresponding to R (red), G (green) and B (blue) are arranged in a matrix, or a large number of sets of three stripe filters R, G and B are arranged so as to be adjacent to each other in the horizontal scan direction, in order to form a color filter. In the cell assembly step of Step S54, a liquid crystal panel (a liquid crystal cell) is assembled by using the glass substrate in which the predetermined pattern is formed in Step S50 and the color filter formed in Step S52. Specifically speaking, liquid crystal is injected between the glass substrate and the color filter to form the liquid crystal panel, for example. In the module assembly step of Step S56, the liquid crystal panel assembled in Step S54 is provided with an electrical circuit designed to cause the liquid crystal panel to perform a display operation and a variety of components including a back light.

Also, the present invention is not limited to application to an exposure apparatus for the manufacturing process of semiconductor devices or liquid crystal devices. For example, it can be widely applied to an exposure apparatus for the manufacture of display devices such as plasma displays, and an exposure apparatus for the manufacture of various devices such as imaging elements (such as CCDs), micro electro mechanical systems, thin-film magnetic heads, and DNA chips. Moreover, the present invention can also be applied to an exposure step (exposure apparatus) when manufacturing masks (photomasks, reticles and the like) having mask patterns of a variety of devices formed therein by using the photolithography technique.

As far as is permitted, disclosures in documents recited in each of the embodiments discussed above, modified examples, and the like are hereby incorporated by reference.

What is claimed is:

1. An exposure apparatus comprising:
    a moving mechanism that moves a first portion of a belt-shaped substrate that has photosensitivity in a first heading along a first direction and that moves a second portion of the substrate in a second heading that is opposite to the first heading along the first direction;
    a stage mechanism that holds a mask that has a pattern, and moves in a third heading along a second direction in synchronization with the movement in the first direction of the first portion and the second portion; and
    a projection optical system that receives light via the pattern, forms a first projection image of the pattern on the first portion so that the third heading on the mask and the first heading on the first portion optically correspond, and forms a second projection image of the pattern on the second portion so that the third heading on the mask and the second heading on the second portion optically correspond.

2. The exposure apparatus according to claim 1, wherein the first direction and the second direction are orthogonal.

3. The exposure apparatus according to claim 1, wherein the first projection image and the second projection image are formed in a row in a direction that is orthogonal to the first direction.

4. The exposure apparatus according to claim 1, wherein the projection optical system has an intermediate imaging optical system that forms a first intermediate image and a second intermediate image of the pattern, a first imaging optical system that makes the first intermediate image and the first projection image optically conjugate, and a second imaging optical system that makes the second intermediate image and the second projection image optically conjugate.

5. The exposure apparatus according to claim 4, wherein the intermediate optical system has a lens group in which light of the pattern enters, and a splitting and reflecting portion that splits light from the lens group into a first light and a second light that advance in mutually separate directions that sandwich the optical axis of the lens group and reflects the first light and the second light to the lens group.

6. The exposure apparatus according to claim 5, wherein the splitting and reflecting portion has a plurality of first reflecting portions that reflect the light that has entered from the lens group in a fourth heading to generate the first light and a plurality of second reflecting portions that reflect the light that has entered from the lens group in a fifth heading to generate the second light and that are disposed at the rear focal position of the lens group or in the vicinity thereof and a plurality of second reflecting portions.

7. The exposure apparatus according to claim 6, wherein the first reflecting portions and the second reflecting portions are alternately provided along the second direction.

8. The exposure apparatus according to claim 6, wherein the plurality of first reflecting portions and the plurality of second reflecting portions have a plurality of mirror elements that are two-dimensionally arranged and whose attitude can be individually changed.

9. The exposure apparatus according to claim 6, further comprising an illumination optical system that radiates light on the pattern of the mask that is held in the stage mechanism, wherein the illumination optical system forms a plurality of light sources corresponding to the arrangement of the plurality of first reflecting portions and the plurality of second reflecting portions at a position that is optically conjugate with the position of the splitting and reflecting portion.

10. The exposure apparatus according to claim 5, wherein the splitting and reflecting portion have a splitting portion that splits the light from the lens group into a first light and a second light, and a reflecting portion that is arranged at the rear focal position of the lens group or the vicinity thereof, and by reflecting the light from the splitting portion causes it to reenter the lens group via the splitting portion.

11. The exposure apparatus according to claim 10, wherein the splitting portion has a polarization beam splitter, and
the reflecting portion has a first reflecting member that reflects the first light that is generated by being transmitted through the polarization beam splitter toward the polarization beam splitter and a second reflecting member that reflects the second light that is generated by being reflected through the polarization beam splitter toward the polarization beam splitter.

12. The exposure apparatus according to claim 5, wherein the splitting and reflecting portion have a diffraction optical surface that is disposed at the rear focal position of the lens group or in the vicinity thereof and that generates a +1st order diffracted light as the first light and a −1st order diffracted light as the second light based on light that is incident from the lens group.

13. The exposure apparatus according to claim 5, wherein the projection optical system has a first group of deflecting members that deflect the first light in the first direction, the second direction and a direction parallel to the optical axis of the intermediate imaging optical system in turn, and a second group of deflecting members that deflect the second light in the first direction, the second direction and a direction parallel to the optical axis of the intermediate imaging optical system in turn.

14. The exposure apparatus according to claim 13, wherein the first group of deflecting members have a first deflecting member that deflects the first light in the second direction, a second deflecting member that deflects the first light from the first deflecting member in the first direction, and a third deflecting member that deflects the first light from the second deflecting member in the direction parallel to the optical axis of the intermediate imaging optical system.

15. The exposure apparatus according to claim 14, wherein the second group of deflecting members have a fourth deflecting member that deflects the second light in the opposite heading to the deflection direction of the first light by the first deflecting member, a fifth deflecting member that deflects the second light from the fourth deflecting member in the same heading as the deflection direction of the first light by the second deflecting member, and a sixth deflecting member that deflects the second light from the fifth deflecting member in the same heading as the deflection direction of the first light by the third deflecting member.

16. The exposure apparatus according to claim 14, wherein the first deflecting member is disposed in the optical path between the intermediate imaging optical system and the formation position of the first intermediate image, the second deflecting member is disposed in the optical path between the formation position of the first intermediate image and the first imaging optical system, and the third deflecting member is disposed in the optical path between the second deflecting member and the first imaging optical system.

17. The exposure apparatus according to claim 13, wherein the second group of deflecting members have a fourth deflecting member that deflects the second light in the second direction, a fifth deflecting member that deflects the second light from the fourth deflecting member in the first direction, and a sixth deflecting member that deflects the second light from the fifth deflecting member in the direction parallel to the optical axis of the intermediate imaging optical system.

18. The exposure apparatus according to claim 5, wherein the projection optical system has a first group of deflecting members that are arranged in the optical path between the intermediate imaging optical system and the first imaging optical system, and a second group of deflecting members that are arranged in the optical path between the intermediate imaging optical system and the second imaging optical system.

19. The exposure apparatus according to claim 13, wherein the first group of deflecting members have a first deflecting member that deflects the first light in the first direction, a second deflecting member that deflects the first light from the first deflecting member in the second direction, and a third deflecting member that deflects the first light from the second deflecting member in the direction parallel to the optical axis of the intermediate imaging optical system.

20. The exposure apparatus according to claim 17, wherein the fourth deflecting member is disposed in the optical path between the intermediate imaging optical system and the formation position of the second intermediate image, the fifth deflecting member is disposed in the optical path between the formation position of the second intermediate image and the second imaging optical system, and the sixth deflecting member is disposed in the optical path between the fifth deflecting member and the second imaging optical system.

21. The exposure apparatus according to claim 13, wherein the second group of deflecting members have a fourth deflecting member that deflects the second light in the first direction, a fifth deflecting member deflects the second light from the fourth deflecting member in the second direction, and a sixth deflecting member that deflects the second light from the fifth deflecting member in the direction parallel to the optical axis of the intermediate imaging optical system.

22. A method of manufacturing a device comprising:
transferring a pattern onto a substrate by using the exposure apparatus according to claim 1;
developing the substrate to which the pattern has been transferred, and forming on the substrate a transfer pattern layer of a shape corresponding to the pattern; and
processing the substrate via the transfer pattern layer.

23. An exposure method comprising:
moving a first portion of a belt-shaped substrate that has photosensitivity in a first heading along a first direction and moving a second portion of the substrate in a second heading that is opposite to the first heading along the first direction;
moving a mask that has a pattern in a third heading along a second direction in synchronization with the movement in the first direction of the first portion and the second portion;
receiving light from the pattern and forming a first projection image of the pattern on the first portion so that the third heading on the mask and the first heading on the first portion optically correspond, and
receiving light from the pattern and forming a second projection image of the pattern on the second portion so that the third heading on the mask and the second heading on the second portion optically correspond.

24. The exposure method according to claim 23, wherein the forming of the first projection image and the forming of the second projection image comprising forming the first projection image and the second projection image, respectively, while the mask is being moved in the third heading.

25. The exposure method according to claim 23, wherein the forming of the second projection image comprising forming the second projection image in a region in which the first projection image is not formed of the second portion of the substrate.

26. The exposure method according to claim 23, wherein
the moving of the first portion and the second portion comprising continuously moving the first portion and the second portion along the first direction, and
the moving of the mask reciprocally comprising moving the mask a plurality of times along the second direction.

27. The exposure method according to claim 23, wherein the first direction and the second section are orthogonal.

* * * * *